(12) United States Patent
Takamiya

(10) Patent No.: US 7,063,937 B2
(45) Date of Patent: Jun. 20, 2006

(54) METHOD FOR MAKING LITHOGRAPHIC PRINTING PLATE

(75) Inventor: Shuichi Takamiya, Haibara-gun (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 79 days.

(21) Appl. No.: 10/808,310

(22) Filed: Mar. 25, 2004

(65) Prior Publication Data

US 2004/0191693 A1      Sep. 30, 2004

(30) Foreign Application Priority Data

Mar. 28, 2003    (JP)    ............................. 2003-090636

(51) Int. Cl.
 *G03F 7/26*   (2006.01)
 *G03F 7/30*   (2006.01)

(52) U.S. Cl. .................. 430/302; 430/309; 430/434; 430/435; 430/494; 430/944; 430/945

(58) Field of Classification Search ............ 430/270.1, 430/302, 309, 434, 435, 494, 944, 945
See application file for complete search history.

(56) References Cited

U.S. PATENT DOCUMENTS

| | | | |
|---|---|---|---|
| 6,399,279 B1 * | 6/2002 | Urano et al. | 430/302 |
| 6,410,207 B1 * | 6/2002 | Nagasaka et al. | 430/302 |
| 6,503,685 B1 | 1/2003 | Shimizu et al. | |
| 6,808,861 B1 * | 10/2004 | Nagasaka et al. | 430/270.1 |
| 2002/0058207 A1 * | 5/2002 | Urano et al. | 430/302 |
| 2002/0146635 A1 * | 10/2002 | Nagasaka et al. | 430/190 |
| 2003/0108814 A1 * | 6/2003 | Miyake et al. | 430/271.1 |

FOREIGN PATENT DOCUMENTS

| | | |
|---|---|---|
| EP | 0 913 253 A1 | 5/1999 |
| EP | 1 162 063 A2 | 12/2001 |
| EP | 1 270 218 A1 | 1/2003 |
| EP | 1 275 797 A1 | 1/2003 |
| EP | 1 287 986 A1 | 3/2003 |
| JP | 11-327163 | * 11/1999 |
| JP | 2001-350261 A | 12/2001 |

\* cited by examiner

*Primary Examiner*—Barbara L. Gilliam
(74) *Attorney, Agent, or Firm*—Buchanan Ingersoll PC

(57) ABSTRACT

A method for making a lithographic printing plate comprising the steps of: light-exposing to infrared radiation, a heat-sensitive presensitized plate of a positive-working mode for use in making a lithographic printing plate, said presensitized plate comprising a substrate and an image recording layer which is formed thereon and comprises a novolak resin containing xylenol as a monomer component and an infrared absorbing dye; and developing the light-exposed plate with an alkaline developing solution comprising at least one surfactant selected from the group consisting of anionic surfactants and amphoteric surfactants.

6 Claims, No Drawings

US 7,063,937 B2

METHOD FOR MAKING LITHOGRAPHIC PRINTING PLATE

FIELD OF THE INVENTION

The present invention relates to a method for making a printing plate that can be used as a master plate for offset printing from a lithographic printing plate precursor of a positive-working mode, i.e., a pre-sensitized plate of a positive-working mode for use in making a lithographic printing plate, which will be hereinafter referred to as a PS plate. More particularly, the present invention relates to a method for making a lithographic printing plate from a PS plate of a positive-working mode for lithographic printing applicable to direct plate making by directly transferring digital signals from computers or the like to the PS plate.

BACKGROUND OF THE INVENTION

There have been great strides made in the study of laser in recent years. In particular, solid lasers and semiconductor lasers that can emit light of wavelengths ranging from the near infrared region to the infrared region are available in the form of high-powered, small-sized laser devices. Such laser devices are remarkably useful as the light sources for light exposure when printing plates are made by direct transfer of digital data from computers or the like to image forming materials.

Conventionally, a light-sensitive image forming material of a positive-working mode designed for direct plate making, which is used with infrared laser comprises a novolak resin as an alkali-soluble resin. For example, Japanese Patent Application Publication (hereunder referred to as "JP KOKAI") No. Hei 7-285275 discloses a light-sensitive image forming material of a positive-working mode. The above-mentioned image forming material comprises an alkali-soluble resin having a phenolic hydroxyl group, such as a novolak resin, to which are added light-sensitive compounds of positive-working mode, i.e., a material capable of generating heat after absorbing light, a variety of onium salts, and quinone diazide compounds. At a non-light exposed portion (which will serve as an image portion) in the image forming material, the above-mentioned light-sensitive compounds of positive-working mode serve as a dissolution blocking agent, in other words, work to substantially decrease the solubility of the alkali-soluble resin. At a light exposed portion (which will become a non-image portion), on the other hand, the light-sensitive compounds do not exhibit any dissolution blocking performance by the generation of heat, so that the image forming material is allowed to dissolve in a developing solution, to complete the removal of the image forming material at the non-image portion. Thus, image formation is achieved.

Further, there is proposed a light-sensitive image forming material of positive-working mode comprising a substance capable of absorbing light to generate heat and a resin of which the solubility in alkaline aqueous solutions is changeable depending upon the application of heat as disclosed, for example, in International Publication No. WO 97/39894 and EP-A-0823327. This type of image forming material can achieve image formation in such a manner that one portion of the image forming material corresponding to an image portion exhibits a low solubility in an alkaline aqueous solution, while the other portion which will be a non-image portion shows an increased solubility in the alkaline aqueous solution by the generation of heat, thereby readily allowing the portion corresponding to the non-image portion to be removed by development.

The conventional PS plate for lithographic printing preferably employs a novolak resin for the reasons that the strong interaction between the novolak resin and the dissolution blocking agent makes a big difference in the solubility in the employed developing solution between the light-exposed portion and the non-light exposed portion, and that the ink receptivity is excellent. For the same reasons as mentioned above, it is preferable to use the novolak resin in the light-sensitive image forming material of a positive-working mode used with infrared laser. Thus, a variety of techniques for making a printing plate from the image forming material containing the novolak resin have been studied. For example, it is proposed to add an anionic or amphoteric surfactant serving as a hydrotropic agent to the alkaline developing solution as disclosed in EP-A-908785. Also, JP KOKAI No. 2002-72501 discloses the use of a particular amphoteric surfactant in the alkaline developing solution.

However, there occurs a problem associated with stability when a positive-type PS plate for lithographic printing is made from a light-sensitive image forming material containing a novolak resin. More specifically, to produce such a PS plate, the image forming material in a melted state is coated on an appropriate substrate, dried and set to form a light-sensitive layer on the substrate. After completion of the production of the PS plate for lithographic printing, the sensitivity of the light-sensitive layer deteriorates with the passage of time. Namely, the stability cannot be maintained for an extended period of time.

Research has been conducted on the development of the image forming material that can satisfy both the sensitivity and the long-term stability, and at the same time that can readily be manufactured. In consideration of those factors, a light-sensitive image forming material comprising a novolak resin is proposed, for example, in JP KOKAI No. 2001-350261, the novolak resin comprising xylenol as a constituent monomer. The above-mentioned novolak resin containing as a monomer component xylenol shows a lower solubility in alkaline aqueous solutions as compared with the conventional novolak resins. Therefore, when this type of novolak resin is used for the image forming material, the image forming material constituting a non-image portion once dissolved in the developing solution tends to form an insoluble matter in the developing solution. Such insoluble matter is accumulated and aggregated to form developing sludge in the developing solution after repetition of the development steps, which becomes a factor that will make the development step unstable. To be more specific about the disadvantages caused by the above-mentioned phenomenon, the developing sludge can be deposited on the resultant plate to impair the images formed thereon, and the developing sludge which settles down and precipitates in a processing bath for development makes the maintenance of the processing bath more burdensome. In the case where the PS plate is subjected to a burning treatment, the developing sludge, if still remaining on the non-image portion of the PS plate, will be carbonized, thereby resulting in scumming, in other words, staining the printed matter.

There has thus been an increasing demand for sharp and clear image formation on the printing plate, in particular, higher sharpness and improved reproducibility of elaborate images including a dot portion and a fine line portion, without impairing the formed images by avoiding the disadvantages caused by the insoluble matter in the developing solution resulting from some component constituting the image recording layer of the image forming material.

SUMMARY OF THE INVENTION

An object of the present invention is to provide a method of making a printing plate from an image recording material comprising a novolak resin prepared using xylenol as a monomer component, which method is capable of ensuring stable development for a long period of time and producing high-definition images with improved sharpness without the generation of sludge in a developing solution that could result from some component for use in an image recording layer of the image recording material.

The inventor of the present invention has intensively studied to achieve the above-mentioned object. As a result, it has been found that generation of the developing sludge can be prevented and excellent image formation can be achieved by using a particular alkaline developing solution when an image recording material comprising a novolak resin prepared using xylenol as a monomer component is subjected to development to make a printing plate. The present invention has been thus accomplished.

Accordingly, the present invention provides a method for making a printing plate from a heat-sensitive PS plate of a positive-working mode for lithographic printing which comprises a substrate and an image recording layer formed thereon, the image recording layer comprising a novolak resin containing xylenol as a monomer component and an infrared (IR) absorbing dye, the method comprising the steps of exposing the PS plate to infrared radiation and developing the light-exposed plate using an alkaline developing solution comprising at least one surfactant selected from the group consisting of an anionic surfactant and an amphoteric surfactant.

In a preferred embodiment of the present invention, the anionic surfactant for use in the developing solution is selected from the group consisting of aromatic anionic surfactants, and the amphoteric surfactant is selected from the group consisting of amino acid based amphoteric surfactants.

DETAILED DESCRIPTION OF THE INVENTION

The present invention will now be explained in detail. First of all, the heat-sensitive PS plate of a positive-working mode for lithographic printing for use in the present invention (which will be hereinafter simply referred to as a PS plate) will be described.

The PS plate for use in the present invention comprises a substrate and an image recording layer which is formed thereon and comprises a novolak resin containing xylenol as a monomer component and an infrared absorbing dye. The image recording layer is also called a heat-sensitive layer.

[Novolak Resin Containing Xylenol Monomer]

In the PS plate for use in the present invention, a novolak resin prepared using xylenol as a monomer (which will be hereinafter referred to as xylenol-containing novolak resin) is employed for the formation of the image recording layer. The above-mentioned novolak resin can be synthesized in accordance with the conventional reaction scheme by reacting phenol with formaldehyde in the presence of an acidic catalyst at atmospheric pressure. The novolak resin for use in the present invention is characterized in that xylenol is used as a starting monomer instead of, or in addition to phenol and/or cresol.

For xylenol used in the novolak resin, any structure can be selected from the six xylenol isomers. Particularly, 3,5-xylenol, 2,3-xylenol, 2,5-xylenol and 3,4-xylenol, which have relatively high melting points, are preferred to improve the stability of the obtained image recording material. Further, it is preferable that the xylenol-containing novolak resin for use in the present invention have a weight-average molecular weight of 500 to 10,000 in consideration of the improvement of printing durability and development performance.

The content of the xylenol monomer used for the preparation of the novolak resin is not particularly limited. The effect of enhancing the long-term stability can be obtained even by a slight content of xylenol monomer, and such an effect can be promoted as the content of xylenol is increased. When the content of the xylenol monomer in the novolak resin is expressed by "X % by weight" and the amount of the xylenol-containing novolak resin in the alkali-soluble resins constituting the image recording layer of the PS plate is expressed by "Y % by weight", it is preferable that the product of X and Y values be 500 or more, that is, the equation: $X \times Y \geqq 500$ be established. When the alkali-soluble resin consists of the xylenol-containing novolak resin, that is, Y=100% by weight, the xylenol may preferably be contained in an amount of 5% by weight or more in the novolak resin to obtain the desired effect. Although there is observed a tendency of reduction in development performance with the increase in the amount of xylenol in the novolak resin, image formation can be recovered adequately by controlling the activity of the employed developing solution. In addition, there is another tendency to upgrade the printing durability with the reduction of development performance, so that the content of xylenol may appropriately be adjusted depending upon the characteristics required of the PS plate for lithographic printing.

It is preferable that the above-mentioned xylenol-containing novolak resin be contained in an amount of 10 to 99% by weight, more preferably 15 to 95% by weight, and most preferably 20 to 90% by weight, with respect to the total solid content of the image recording layer. The above-mentioned range is considered to be appropriate from the aspects of both the durability and the sensitivity of the image recording layer. When the binder used for preparation of the image recording layer comprises the above-mentioned xylenol-containing novolak resin and any other alkali-soluble resins than the xylenol-containing novolak resin, which will be explained later, it is desirable that the amount of the binder with respect to the total solid content of the image recording layer be within the above-mentioned range.

[Other Alkali-soluble Resins than Xylenol-containing Novolak Resin]

The particular novolak resin as mentioned above is essential as a binder component for use in the image recording layer. Other alkali-soluble resins may be used in combination with the above-mentioned novolak resin as far as the effect obtained by the xylenol-containing novolak resin will not be impaired. Such alkali-soluble resins that can be used in combination with the xylenol-containing novolak resin include a variety of alkali-soluble polymeric compounds, for example, general-purpose novolak resins free of a xylenol monomer conventionally known in the art, phenolic modified xylene resin, polyhydroxystyrene, polyhalogenated hydroxystyrene, an acrylic resin having phenolic hydroxyl group as disclosed in JP KOKAI No. Sho 51-34711, an acrylic resin having sulfonamide group as disclosed in JP KOKAI No. Hei 2-866, a variety of urethane resins, and so on.

The general-purpose novolak resins with a weight-average molecular weight of about 12,000 or less include the conventional novolak resins, for example, phenol-formaldehyde resins and cresol-formaldehyde resins such as m-cresol-formaldehyde resin, p-cresol-formaldehyde resin, o-cresol-formaldehyde resin, m-/p-cresol-formaldehyde resin, and mixture of phenol and cresol (m-, p-, o-, m-/p-, m-/o- or o-/p-cresol)-formaldehyde resin.

Preferable examples of the urethane resins are those as described in JP KOKAI Nos. Sho 63-124047, Sho 63-261350, Sho 63-287942, Sho 63-287943, Sho 63-287944, Sho 63-287946, Sho 63-287947, Sho 63-287948, Sho 63-287949, Hei 1-134354 and Hei 1-255854.

Particularly preferable alkali-soluble resins used in combination with the xylenol-containing novolak resin include polymeric compounds having in the molecule thereof a functional group selected from the group consisting of (a-1) phenolic hydroxyl group, (a-2) sulfonamide group, and (a-3) active imide group. Specific examples are as follows.

Examples of the polymeric compounds having phenolic hydroxyl group (a-1) include novolak resins such as phenol-formaldehyde resin, m-cresol-formaldehyde resin, p-cresol-formaldehyde resin, m- and p-mixed cresol-formaldehyde resin, and mixture of phenol and cresol (m-, p- or m-/p-cresol)-formaldehyde resin, and pyrogallol-acetone resin. In addition to the above, the use of polymeric compounds having a phenolic hydroxyl group in the side chain thereof is preferable. Such polymeric compounds having a phenolic hydroxyl group in the side chain thereof can include polymeric compounds prepared by subjecting a polymerizable monomer consisting of a low-molecular weight compound having at least one phenolic hydroxyl group and at least one polymerizable unsaturated bond to homopolymerization or copolymerization with other polymerizable monomers.

The polymerizable monomer having phenolic hydroxyl group includes acrylamide, methacrylamide, acrylic ester, methacrylic ester, and hydroxystyrene, each having a phenolic hydroxyl group. More specifically, preferably used are N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate. The resins having a phenolic-hydroxyl group may be used in combination. Further, copolymers of phenol having as a substituent an alkyl group having 3 to 8 carbon atoms with formaldehyde, such as t-butyl phenol-formaldehyde resin and octyl phenol-formaldehyde resin as disclosed in U.S. Pat. No. 4,123,279 may be used in combination.

Examples of the polymeric compounds having sulfonamide group (a-2) include those prepared by subjecting a polymerizable monomer having sulfonamide group to homopolymerization or copolymerization with other polymerizable monomers. Such a polymerizable monomer having sulfonamide group includes a polymerizable monomer consisting of a low-molecular weight compound having in the molecule thereof at least one sulfonamide group (—NH—SO$_2$—) wherein at least one hydrogen atom is bonded to nitrogen atom, and at least one polymerizable unsaturated bond. In particular, preferably used are low-molecular weight compounds having acryloyl group, allyl group or vinyloxy group in combination with poly- or mono-substituted aminosulfonyl group or substituted sulfonylimino group.

With respect to the polymeric compounds (a-3), those having active imide group in the molecule thereof are preferred. Examples of those compounds include polymeric compounds prepared by subjecting a polymerizable monomer consisting of a low-molecular weight compound having in the molecule thereof at least one active imide group and at least one polymerizable unsaturated bond to homopolymerization or copolymerization with other polymerizable monomers.

Specific examples of the polymeric compounds (a-3) include N-(p-toluenesulfonyl)methacrylamide and N-(p-toluenesulfonyl)acrylamide, which can be preferably used in the present invention.

Furthermore, to obtain other alkali-soluble resins than the xylenol-containing novolak resin for use in the image recording layer, there can be preferably employed polymeric compounds prepared by copolymerizing two or more polymerizable monomers selected from the above-mentioned polymerizable monomers having a phenolic hydroxyl group, sulfonamide group and active imide group, or copolymerizing the above-mentioned two or more polymerizable monomers with other polymerizable monomers. In the case where the polymerizable monomer having a phenolic hydroxyl group is copolymerized with the polymerizable monomer having sulfonamide group and/or the polymerizable monomer having active imide group, it is preferable that the ratio by weight of the monomer having a phenolic hydroxyl group to the monomer having sulfonamide group and/or the monomer having active imide group be in the range of (50:50) to (5:95), preferably in the range of (40:60) to (10:90).

In the case where a copolymer of the polymerizable monomer having a phenolic hydroxyl group, sulfonamide group or active imide group with other polymerizable monomers is contained as an alkali-soluble resin in the image recording layer in addition to the xylenol-containing novolak resin, the monomer components contributing to the alkali-solubility to impart the sufficient alkali-solubility to the image recording material and to fully achieve the effect of improving the latitude for development are preferably contained in an amount of 10 mol % or more, more preferably 20 mol % or more.

The monomer components that can be used for copolymerization with the above-mentioned polymerizable phenolic hydroxyl group-containing monomers, sulfonamide group-containing monomers, and active imide group-containing monomers are classified into the following groups (1) to (12). However, the monomer components are not limited to the following examples.

(1): Acrylic esters and methacrylic esters having an aliphatic hydroxyl group, such as 2-hydroxyethyl acrylate and 2-hydroxyethyl methacrylate.

(2): Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(3): Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(4): Acrylamides and methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(5): Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(6): Vinyl esters such as vinyl acetate, vinyl chloroacetate, vinyl butyrate, and vinyl benzoate.

(7): Styrenes such as styrene, α-methylstyrene, methylstyrene, and chloromethylstyrene.

(8): Vinyl ketones such as methyl vinyl ketone, ethyl vinyl ketone, propyl vinyl ketone, and phenyl vinyl ketone.

(9): Olefins such as ethylene, propylene, isobutylene, butadiene, and isoprene.

(10): N-vinylpyrrolidone, acrylonitrile, and methacrylonitrile.

(11): Unsaturated imides such as maleimide, N-acryloylacrylamide, N-acetylmethacrylamide, N-propionylmethacrylamide, and N-(p-chlorobenzoyl)methacrylamide.

(12): Unsaturated carboxylic acids such as acrylic acid, methacrylic acid, maleic anhydride, and itaconic acid.

In the case where other alkali-soluble resins than the xylenol-containing novolak resin is a homopolymer of the above-mentioned phenolic hydroxyl group-containing polymerizable monomer, sulfonamide group-containing polymerizable monomer, or active imide group-containing polymerizable monomer, or a copolymer comprising the above-mentioned polymerizable monomer, the weight-average molecular weight (Mw) of the alkali-soluble resin may be preferably 2,000 or more, more preferably in the range of 5,000 to 300,000, and the number-average molecular weight (Mn) of the obtained polymer may be preferably 500 or more, more preferably in the range of 800 to 250,000. The polydispersity (Mw/Mn) is desirably in the range of 1.1 to 10.

Further, an alkali-soluble polymer having a carboxyl group (hereinafter referred to as (B1) component) can be used as an alkali-soluble resin in combination with the xylenol-containing novolak resin. The (B1) component may be any of alkali-soluble polymer having a carboxyl group, and preferred are the polymers (b1-1) and (b1-2) which are defined below.

(b1-1) Alkali-soluble Polymer having a Polymerizable Monomer Unit Represented By the Following General Formula (i)

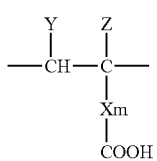

wherein Xm represents a single bond or a bivalent connecting group, Y represents hydrogen atom or a carboxyl group, and Z represents hydrogen atom, alkyl or carboxyl group.

A monomer constructing the monomer unit of the formula (i) includes a polymerizable monomer having at least one carboxyl group and at least one polymerizable unsaturated group in the molecule thereof. Specific examples of the polymerizable monomer are α,β-unsaturated carboxylic acids such as acrylic acid, methacrylic acid, maleic acid, maleic anhydride, itaconic acid, itaconic anhydride and the like.

A monomer which is copolymerized with the above polymerizable monomer having a carboxyl group includes those listed below as (1) to (11), but the present invention is not restricted to these specific ones at all:

(1) acrylic acid esters and methacrylic acid esters each carrying an aliphatic hydroxyl group such as 2-hydroxyethyl acrylate and 2-hydroxyethyl methacrylate;

(2) alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate;

(3) alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethyl methacrylate;

(4) acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide;

(5) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(6) vinyl esters such as vinyl acetate, vinyl chloroacetate, vinyl butyrate and vinyl benzoate;

(7) styrenes such as styrene, α-methyl styrene, methyl styrene and chloromethyl styrene;

(8) vinyl ketones such as methyl vinyl ketone, ethyl vinyl ketone, propyl vinyl ketone and phenyl vinyl ketone;

(9) olefins such as ethylene, propylene, isobutylene, butadiene and isoprene;

(10) N-vinyl pyrrolidone, N-vinyl carbazole, 4-vinyl pyridine, acrylonitrile, methacrylonitrile or the like;

(11) unsaturated imides such as maleimide, N-acryloyl acrylamide, N-acetyl methacrylamide, N-propionyl methacrylamide and N-(p-chlorobenzoyl) methacrylamide.

Alternatively, a monomer represented by the following general formula (ii) may be preferably used.

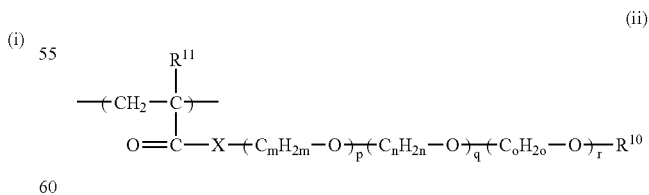

wherein X represents O, S or N—$R^{12}$; $R^{10}$ to $R^{12}$ represent each independently hydrogen atom or an alkyl group; m, n and o represent each independently an integer of from 2 to 5; $C_mH_{2m}$, $C_nH_{2n}$ and $C_oH_{2o}$ are independently in the form of linear or branched chain; p, q and r represent each independently an integer of from 0 to 3,000, and p+q+r≧2.

The alkyl group represented by $R^{10}$ to $R^{12}$ is preferably an alkyl group having 1 to 12 carbon atoms, and specifically includes methyl, ethyl, n-propyl and isopropyl groups and the like. In the formula, p, q and r represent preferably an integer of from 0 to 500, and more preferably from 0 to 100.

Examples of monomers corresponding to the repeating unit represented by the formula (ii) are listed below, but the present invention is not restricted to these specific ones at all.

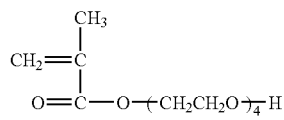
(1)

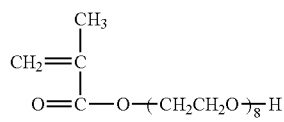
(2)

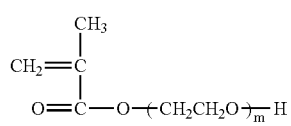
(Average Molecular Weight of Alkyleneoxides: 1000)
(3)

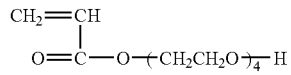
(4)

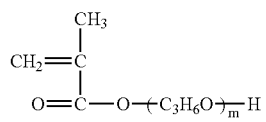
(Average Molecular Weight of Alkyleneoxides: 1000)
(5)

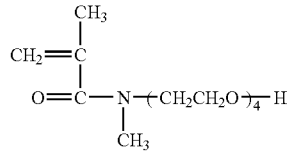
(6)

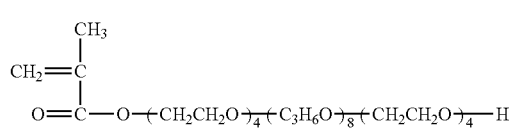
(7)

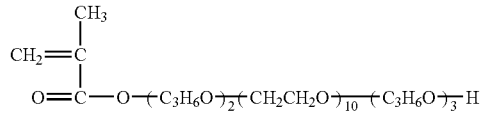
(8)

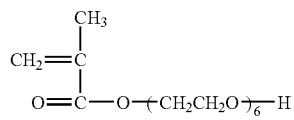
(9)

-continued

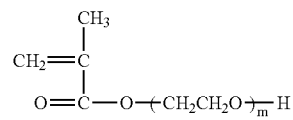
(Average Molecular Weight of Alkyleneoxides: 500)
(10)

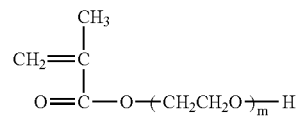
(Average Molecular Weight of Alkyleneoxides: 2000)
(11)

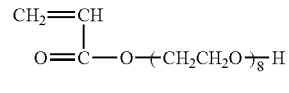
(12)

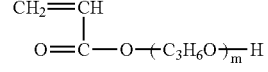
(Average Molecular Weight of Alkyleneoxides: 1500)
(13)

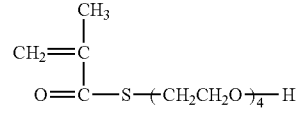
(14)

The repeating unit represented by the formula (ii) can be prepared by reacting a commercially available hydroxy poly(oxyalkylene) material such as Pluronic (trade name) manufactured by Asahi Dennka Kogyo Co., Ltd., AdekaPolyether (trade name) manufactured by Asahi Dennka Kogyo Co., Ltd., Carbowax (trade name) manufactured by Glyco Products, Toriton (trade name) manufactured by Rohm and Haas and P. E. G manufactured by Dai-ichi Kogyo Seiyaku Co., Ltd., with acrylic acid, methacrylic acid, acrylchloride, methacrylchloride, acrylic anhydride or the like in a well known method.

Alternatively, poly(oxyalkylene) diacrylate can be used, which is prepared by a well known method.

Commercially available monomers include a hydroxyl-terminated polyalkylene glycol mono(meth)acrylate manufactured by Nippon Yushi Co., Ltd. such as Blenmer PE-90, Blenmer PE-200, Blenmer PE-350, Blenmer AE-90, Blenmer AE-200, Blenmer AE-400, Blenmer PP-1000, Blenmer PP-500, Blenmer PP-800, Blenmer AP-150, Blenmer AP-400, Blenmer AP-550, Blenmer AP-800, Blenmer 50PEP-300, Blenmer 70PEP-350B, Blenmer AEP Series, Blenmer 55PET-400, Blenmer 30PET-800, Blenmer 55PET-800, Blenmer AET Series, Blenmer 30PPT-800, Blenmer 50PPT-800, Blenmer 70PPT800, Blenmer APT Series, Blenmer 10PPB-500B, Blenmer 10APB-500B and the like. Similarly, there are an alkyl-terminated polyalkylene glycol mono(meth)acrylate manufactured by Nippon Yushi Co., Ltd. such as Blenmer PME-100, Blenmer PME-200, Blenmer PME-400, Blenmer PME-1000, Blenmer PME-4000, Blenmer AME-400, Blenmer 50POEP-800B, Blenmer 50AOEP-800B, Blenmer PLE-200, Blenmer ALE-200, Blenmer ALE-800, Blenmer PSE-400, Blenmer PSE-1300, Blenmer ASEP Series, Blenmer PKEP Series, Blenmer AKEP Series, Blenmer ANE-300, Blenmer ANE-1300, Blenmer PNEP Series, Blenmer PNPE Series, Blenmer 43 ANEP-500, Blenmer 70ANEP-550, and products manufactured by Kyoei Chemicals Co., Ltd. such as Light Ester MC, Light Ester 130MA, Light Esters 041MA, Light Acrylate BO-A, Light Acrylate EC-A, Light Acrylate MTG-A, Light Acrylate 130A, Light Acrylate DPM-A, Light Acrylate P-200A, Light Acrylate NP-4EA, Light Acrylate NP-8EA and the like.

The minimum constitutional unit in the polymer (b1-1), which has the polymerizable monomer component having at least one carboxyl group and at least one polymerizable unsaturated group may be alone, or two or more in combination. It is possible to use the compound obtained by copolymerizing two or more minimum constitutional units having the same acidic group, or two or more minimum constitutional units having different acidic groups. A method which is usable for copolymerization may be a conventional method such as a graft copolymerization, a block copolymerization, a random copolymerization and the like.

(b 1-2) Alkali-soluble Polymer Having a Carboxyl Group, which Has as a Basic Skeleton, a Reaction Product of a Diol Compound Having a Carboxyl Group Represented By the Following General Formula (iii), (iv) or (v) and a Diisocyanate Compound Represented By the Following Formula (viii)

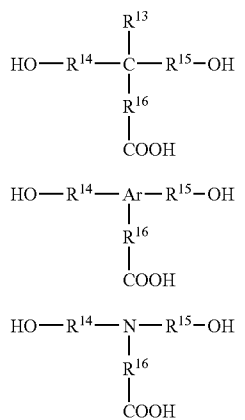

wherein $R^{13}$ represents hydrogen atom, or an alkyl, alkenyl, aralkyl, aryl, alkoxy or aryloxy group which may have a substituent such as alkyl, aryl, alkoxy, ester, urethane, amide, ureido and halogeno group, and preferably hydrogen atom, an alkyl group having 1 to 8 carbon atoms, an alkenyl group having 2 to 8 carbon atoms, and an aryl group having 6 to 15 carbon atoms; $R^{14}$, $R^{15}$ and $R^{16}$, which may be the same or different, each represent a single bond, a bivalent aliphatic or aromatic hydrocarbon group which may have a substituent such as alkyl, alkenyl, aralkyl, aryl, alkoxy and halogeno group, preferably an alkylene group having 1 to 20 carbon atoms and an arylene group having 6 to 15 carbon atoms, and more preferably an alkylene group having 1 to 8 carbon atoms.

Where necessary, $R^{14}$, $R^{15}$ and $R^{16}$ may have additionally a functional group which is not reactive to an isocyanate group, such as ester group, urethane group, amide group, ureido group and unsaturated bond between carbons. Two or three of $R^{13}$, $R^{14}$, $R^{15}$ and $R^{16}$ may form a ring together.

Ar represents a trivalent aromatic hydrocarbon group which may have a substituent, and preferably an aromatic group having 6 to 15 carbon atoms.

$$OCN-R^{18}-NCO \quad \text{(viii)}$$

wherein $R^{18}$ represents a bivalent aliphatic or aromatic hydrocarbon group which may have a substituent such as alkyl, alkenyl, aralkyl, aryl, alkoxy and halogeno group. Where necessary, $R^{18}$ may have additionally a functional group which is not reactive to an isocyanate group, such as ester group, urethane group, amide group, ureido group and unsaturated bond between carbons.

The diol compound having a carboxyl group represented by the formula (iii), (iv) or (v) includes 3,5-dihydroxy benzoic acid, 2,2-bis(hydroxymethyl) propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl) pentanoic acid, tartaric acid, N,N-bis(2-hydroxyethyl)-3-carboxy-propionamide, and the like.

The alkali-soluble polymer having a carboxyl group (b1-2) is preferably a reaction product wherein a diol compound represented the following general formula (vi) or (vii) is combined.

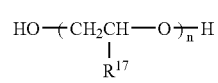

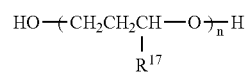

wherein $R^{17}$ each represents hydrogen atom or an alkyl group having 1 to 8 carbon atoms, n represents an integer of 2 or more. The alkyl group having 1 to 8 carbon atoms represented by $R^{17}$ includes methyl, ethyl, isopropyl, n-butyl and isobutyl groups.

Specific examples of the diol represented by the formula (vi) or (vii) are shown below, but the present invention is not restricted to these specific ones at all.

Examples of the Compound Represented by the Formula (vi):
HO—(—CH$_2$CH$_2$O—)$_3$—H
HO—(—CH$_2$CH$_2$O—)$_4$—H
HO—(—CH$_2$CH$_2$O—)$_5$—H
HO—(—CH$_2$CH$_2$O—)$_6$—H
HO—(—CH$_2$CH$_2$O—)$_7$—H
HO—(—CH$_2$CH$_2$O—)$_8$—H
HO—(—CH$_2$CH$_2$O—)$_{10}$—H
HO—(—CH$_2$CH$_2$O—)$_{12}$—H
Polyethylene glycol (average molecular weight: 1000)
Polyethylene glycol (average molecular weight: 2000)
Polyethylene glycol (average molecular weight: 4000)
HO—(—CH$_2$CH(CH$_3$)O—)$_3$—H
HO—(—CH$_2$CH(CH$_3$)O—)$_4$—H
HO—(—CH$_2$CH(CH$_3$)O—)$_6$—H
Polypropylene glycol (average molecular weight: 1000)
Polypropylene glycol (average molecular weight: 2000)
Polypropylene glycol (average molecular weight: 4000)

Examples of the compound represented by the formula (vii):
HO—(—CH$_2$CH$_2$CH$_2$O—)$_3$—H
HO—(—CH$_2$CH$_2$CH$_2$O—)$_4$—H

HO—(—CH$_2$CH$_2$CH$_2$O—)$_8$—H
HO—(—CH$_2$CH$_2$CH(CH$_3$)O—)$_{12}$—H

Specific examples of the diisocyanate compound represented by the formula (viii) are aromatic diisocyanate compounds such as 2,4-tolylenediisocyanate, dimer of 2,4-tolylenediisocyanate, 2,6-tolylenediisocyanate, p-xylylenediisocyanate, m-xylylenediisocyanate, 4,4'-diphenylmethan diisocyanate, 1,5-naphthalene diisocyanate and 3,3'-dimethylbiphenyl-4,4'-diisocyanate, aliphatic diisocyanate compounds such as hexamethylene diisocyanate, trimethylhexamethylene diisocyanate, lysine diisocyanate and dimer acid diisocyanate, aliphatic diisocyanate compounds such as isophorone diisocyanate, 4,4'-methylene bis(cyclohexylisocyanate), methylcyclohexane-2,4(2,6)-diisocyanate and 1,3-(isocyanate methyl)cyclohexane, and a reaction product of a diol and a diisocyanate such as an adduct of 1 mole of 1,3-butylene glycol and 2 moles of tolylenediisocyanate.

In the synthesis of the polymer (b1-2), a molar ratio of the diisocyanate compound and the diol compound which are used is preferably from 0.8:1 to 1.2:1. When an isocyanate group remains at the terminal of polymers obtained, the polymer can be treated with alcohols or amines to finally synthesize ones free of an isocyanate group.

As the component (B1), any one or any combination of at least two selected from the polymers (b1-1) and (b1-2) can be used.

The amount of the repeating unit having a carboxyl group in the component (B1) is generally 2 mol % or more on the basis of the total monomeric amount in the component (B1), preferably from 2 to 70 mol %, and more preferably from 5 to 60 mol %.

The component (B1) has preferably a weight-average molecular weight of from 3,000 to 300,000, and more preferably from 6,000 to 100,000.

Other alkali-soluble resins than the xylenol-containing novolak resin, which are mentioned above, can be used alone or in combination, and the alkali-soluble resin can be used preferably in the amount ratio by weight to the xylenol-containing novolak resin of from 0.05/1 to 1/0.1, and more preferably from 0.1/1 to 1/0.2.

[IR-absorbing Dye]

IR-absorbing dyes used in the image recording layer according to the present invention is not limited to specific ones, provided that is a dye which is capable of absorbing infrared ray and generating heat, and include various dyes which are known in the art as an IR-absorbing dye.

The IR-absorbing dye materials may be commercially available ones or those known in the literature (see, for instance, "SENRYO BINRAN", edited by YUKI GOSEI KAGAKU KYOKAI, Published in Showa 45 (1970)) and specific examples thereof are azo dyes, metal complex azo dyes, pyrazolone azo dyes, quinoneimine dyes, methine dyes, cyanine dyes, and the like. Among them, the ones capable of absorbing infrared ray or near infrared ray are suitable, since they can be used suitably with a laser emitting infrared ray or near infrared ray.

Examples of such dyes which absorbing infrared ray or near infrared ray include cyanine dyes such as those disclosed in, for example, Japanese Un-Examined Patent Publication Nos. Sho 58-125246, Sho 59-84356, Sho 59-202829 and Sho 60-78787; methine dyes such as those disclosed in, for instance, Japanese Un-Examined Patent Publication Nos. Sho 58-173696, Sho 58-181690 and Sho 58-194595; naphthoquinone dyes such as those disclosed in, for instance, Japanese Un-Examined Patent Publication Nos. Sho 58-112793, Sho 58-224793, Sho 59-48187, Sho 59-73996, Sho 60-52940 and Sho 60-63744; squarylium dyes such as those described in, for instance, Japanese Un-Examined Patent Publication No. Sho 58-112792; and cyanine dyes such as those disclosed in, for instance, G.B. Patent No. 434,875.

Preferably used as the dye herein also include, for instance, sensitizing agents capable of absorbing near infrared rays disclosed in U.S. Pat. No. 5,156,938; substituted arylbenzo (thio) pyrylium salts disclosed in U.S. Pat. No. 3,881,924; trimethine thiopyrylium salts disclosed in Japanese Un-Examined Patent Publication No. Sho 57-142645 (U.S. Pat. No. 4,327,169); pyrylium compounds disclosed in Japanese Un-Examined Patent Publication Nos. Sho 58-181051, Sho 58-220143, Sho 59-41363, Sho 59-84248, Sho 59-84249, Sho 59-146063 and 59-146061; cyanine dyes disclosed in Japanese Un-Examined Patent Publication No. Sho 59-216146; pentamethine thiopyrium salts disclosed in U.S. Pat. No. 4,283,475; pyrilium compounds disclosed in Japanese Examined Patent Publication Nos. Hei 5-13514 and Hei 5-19702; and commercially available ones such as Epolight III-178, Epolight III-130, Epolight III-125 and like (available from Epoline Company).

Preferably used in the heat-sensitive layer also include dyes such as those represented by the general formulas (I) and (II) disclosed in U.S. Pat. No. 4,756,993. Said dye exhibits remarkably strong interaction with an alkali-soluble resin, and therefore it is excellent in resistance to alkali-development of the unexposed area in the heat-sensitive layer.

The content of the dye in the heat-sensitive layer ranges from 3 to 50% by weight from the aspect of sensitivity and durability of the heat-sensitive layer, preferably from 5 to 40% by weight and more preferably from 8 to 35% by weight on the basis of total weight of the heat-sensitive layer.

Specific examples of the IR-absorbing dye are shown below, but the present invention is not restricted to these specific compounds.

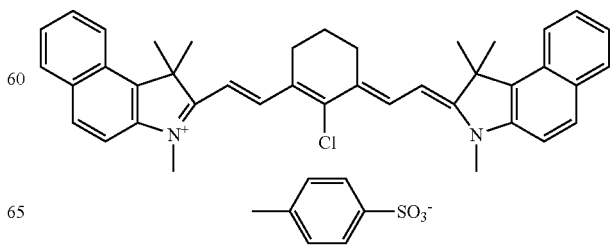

Cyanine Dye A

-continued

Cyanine Dye B

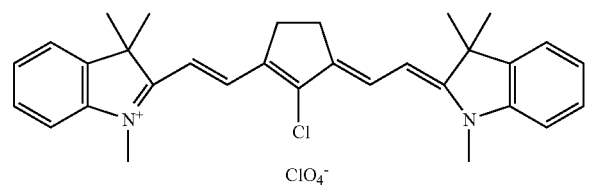

Cyanine Dye C

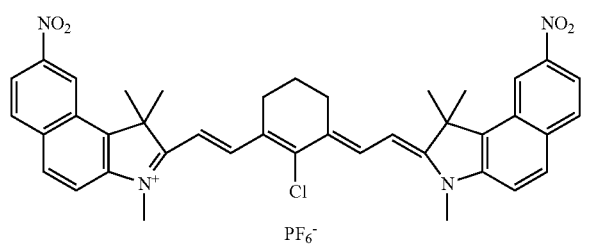

Cyanine Dye D

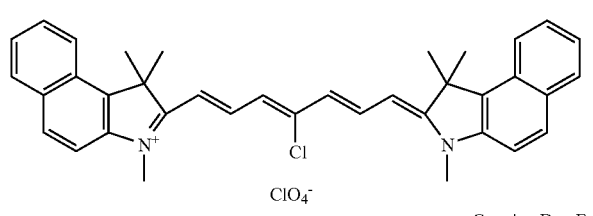

Cyanine Dye E

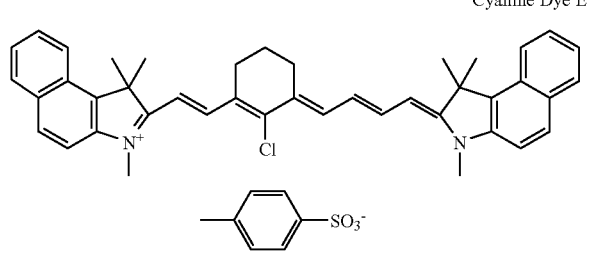

[Other Additives]

For the formation of the image recording layer, a variety of additives may be used if necessary, in addition to the above-mentioned components so as not to impair the effects of the present invention.

Compound Capable of Inhibiting the Solubility of Image Recording Material in Developing Solution In the heat-sensitive PS plate for lithographic printing for use in the present invention, the image recording layer may further comprise a variety of inhibitors that can inhibit the alkali-soluble polymer from easily dissolving in the developing solution. The above-mentioned inhibitors are not particularly limited, and quaternary ammonium salts and polyethylene glycol compounds can be used.

The quaternary ammonium salts are not particularly limited, but include tetraalkyl ammonium salt, trialkylaryl ammonium salt, dialkyldiaryl ammonium salt, alkyltriaryl ammonium salt, tetraaryl ammonium salt, cyclic ammonium salt, and bicyclic ammonium salt.

Specific examples of the quaternary ammonium salts are tetrabutyl ammonium bromide, tetrapentyl ammonium bromide, tetrahexyl ammonium bromide, tetraoctyl ammonium bromide, tetralauryl ammonium bromide, tetraphenyl ammonium bromide, tetranaphthyl ammonium bromide, tetrabutyl ammonium chloride, tetrabutyl ammonium iodide, tetrastearyl ammonium bromide, lauryl trimethyl ammonium bromide, stearyl trimethyl ammonium bromide, behenyl trimethyl ammonium bromide, lauryl triethyl ammonium bromide, phenyl trimethyl ammonium bromide, 3-trifluoromethylphenyl trimethyl ammonium bromide, benzyl trimethyl ammonium bromide, dibenzyl dimethyl ammonium bromide, distearyl dimethyl ammonium bromide, tristearylmethyl ammonium bromide, benzyltriethyl ammonium bromide, hydroxyphenyl trimethyl ammonium bromide, and N-methylpyridinium bromide. In particular, quaternary ammonium salts described in JP KOKAI Nos. 2003-107688 and 2003-167332 are preferably used.

It is preferable that the quaternary ammonium salt serving as the above-mentioned inhibitor be contained in the image recording layer in an amount of 0.1 to 50% by weight from the aspect of sufficient inhibiting effect and no adverse effect on film-forming properties of binders, more preferably 1 to 30% by weight, in terms of the solid content with respect to the total weight of the solid content of the image recording layer.

The polyethylene glycol compound used as the aforementioned inhibitor is not particularly limited. The polyethylene glycol with the following structure is preferably employed in the present invention.

$$R^1-[-O-(R^3-O-)_m-R^2]_n$$

wherein $R^1$ is a residue of a polyhydric alcohol or polyhydric phenol; $R^2$ is a hydrogen atom, or an alkyl group, an alkenyl group, an alkynyl group, alkyloyl group, an aryl group, or an aryloyl group, which has 1 to 25 carbon atoms and may have a substituent; $R^3$ is a residue of an alkylene group which may have a substituent; m is 10 or more on average; and n is an integer of 1 to 4.

Examples of the polyethylene glycol compounds having the above-mentioned structure include polyethylene glycols, polypropylene glycols, polyethylene glycol alkyl ethers, polypropylene glycol alkyl ethers, polyethylene glycol aryl ethers, polypropylene glycol aryl ethers, polyethylene glycol alkylaryl ethers, polypropylene glycol alkylaryl ethers, polyethylene glycol glycerin esters, polypropylene glycol glycerin esters, polyethylene glycol sorbitol esters, polypropylene glycol sorbitol esters, polyethylene glycol fatty acid esters, polypropylene glycol fatty acid esters, polyethylene glycol ethylenediamines, polypropylene glycol ethylenediamines, polyethylene glycol diethylenetriamines, and polypropylene glycol diethylenetriamines.

Specific examples of the above-mentioned polyethylene glycol compounds are polyethylene glycol 1000, polyethylene glycol 2000, polyethylene glycol 4000, polyethylene glycol 10000, polyethylene glycol 20000, polyethylene glycol 50000, polyethylene glycol 100000, polyethylene glycol 200000, polyethylene glycol 500000, polypropylene glycol 1500, polypropylene glycol 3000, polypropylene glycol 4000, polyethylene glycol methyl ether, polyethylene glycol ethyl ether, polyethylene glycol phenyl ether, polyethylene glycol dimethyl ether, polyethylene glycol diethyl ether, polyethylene glycol diphenyl ether, polyethylene glycol lauryl ether, polyethylene glycol dilauryl ether, polyethylene glycol nonyl ether, polyethylene glycol cetyl ether, polyethylene glycol stearyl ether, polyethylene glycol distearyl ether, polyethylene glycol behenyl ether, polyethylene glycol dibehenyl ether, polypropylene glycol methyl ether, polypropylene glycol ethyl ether, polypropylene glycol phenyl ether, polypropylene glycol dimethyl ether, polypropylene glycol diethyl ether, polypropylene glycol diphenyl ether, polypropylene glycol lauryl ether, polypropylene glycol dilauryl ether, polypropylene glycol nonyl ether, polyethylene glycol acetyl ester, polyethylene glycol diacetyl ester, polyethylene glycol benzoic ester, polyethylene glycol lauryl ester, polyethylene glycol dilauryl ester, polyethylene glycol nonyl ester, polyethylene glycol cetyl ester, polyethylene glycol stearoyl ester, polyethylene glycol distearyl ester, polyethylene glycol behenyl ester, polyethylene glycol dibehenic ester, polypropylene glycol acetyl ester, polypropylene glycol diacetyl ester, polypropylene glycol benzoic ester, polypropylene glycol dibenzoic ester, polypropylene glycol lauryl ester, polypropylene glycol dilauryl ester, polypropylene glycol nonyl ester, polyethylene glycol glycerin ether, polypropylene glycol glycerin ether, polyethylene glycol sorbitol ether, polypropylene glycol sorbitol ether, polyethylene glycol ethylenediamine, polypropylene glycol ethylenediamine, polyethylene glycol diethylenetriamine, polypropylene glycol diethylenetriamine, and polyethylene glycol pentamethylenehexamine.

The amount of the polyethylene glycol compound may be in the range of 0.1 to 50% by weight from the aspect of sufficient inhibiting effect and no adverse effect on film-forming properties of binders, preferably 1 to 30% by weight, in terms of the solid content with respect to the total weight of the solid content for use in the image recording layer.

The decrease in sensitivity, which is caused when the solubility of the alkali-soluble polymer in the developing solution is inhibited as mentioned above, can effectively be avoided by the addition of a lactone compound. When the developing solution permeates through the light-exposed portion of the image recording layer, the lactone compound reacts with the developing solution to form a carboxylic acid compound, which will contribute to dissolving of the light-exposed portion of the image recording layer. Thus, the decrease in sensitivity can be prevented.

The lactone compound for use in the present invention is not particularly limited. For example, lactone compounds represented by the following formulas (L-I) and (L-II) can be used.

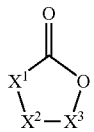

(L-I)

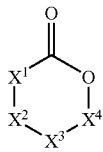

(L-II)

In the above formulas (L-I) and (L-II), $X^1$, $X^2$, $X^3$ and $X^4$ are each an atom or a group for forming a ring, which may be the same or different and independently have a substituent. At least one of $X^1$, $X^2$ or $X^3$ in the formula (L-I), and at least one of $X^1$, $X^2$, $X^3$ or $X^4$ in the formula (L-II) have an electron attractive substituent or a substituent having an electron attractive substituent.

The atoms or groups represented by $X^1$, $X^2$, $X^3$ and $X^4$ which constitute the ring are each a non-metallic atom having two single bonds or a group including the above-mentioned non-metallic atom for forming the ring.

Preferable non-metallic atoms and preferable groups including the non-metallic atoms are methylene group, sulfinyl group, carbonyl group, thiocarbonyl group, sulfonyl group, sulfur atom, oxygen atom, and selenium atom. In particular, methylene group, carbonyl group and sulfonyl group are preferably used.

As mentioned above, at least one of $X^1$, $X^2$ or $X^3$ in the formula (L-I), and at least one of $X^1$, $X^2$, $X^3$ or $X^4$ in the formula (L-II) have an electron attractive group. The electron attractive group herein used is a group where the Hammett's substituent constant represented by σ ρ is positive. For the Hammett's substituent constant, Journal of Medicinal Chemistry, 1973, vol. 16, No. 11, 1207–1216 can serve as a reference. Examples of the electron attractive group where the Hammett's substituent constant represented by σ ρ is a positive value include a halogen atom such as fluorine atom (σ ρ value of 0.06), chlorine atom (σ ρ value of 0.23), bromine atom (σ ρ value of 0.23) and iodine atom (σ ρ value of 0.18); trihaloalkyl group such as tribromomethyl group (σ ρ value of 0.29), trichloromethyl group (σ ρ value of 0.33) and trifluoromethyl group (σ ρ value of 0.54); cyano group (σ ρ value of 0.66); nitro group (σ ρ value of 0.78); aliphatic, aryl or heterocyclic sulfonyl group such as methanesulfonyl group (σ ρ value of 0.72); aliphatic, aryl or heterocyclic acyl group such as acetyl group (σ ρ value of 0.50) and benzoyl group (σ ρ value of 0.43); alkynyl group such as C≡CH group (σ ρ value of 0.23); aliphatic, aryl or heterocyclic oxycarbonyl group such as methoxycarbonyl group (σ ρ value of 0.45) and phenoxycarbonyl group (σ ρ value of 0.44); carbamoyl group (σ ρ value of 0.36); sulfamoyl group (σ ρ value of 0.57); sulfoxide group; heterocyclic group; oxo group; and phosphoryl group.

Preferable examples of the electron attractive groups are amide group, azo group, nitro group, fluoroalkyl group having 1 to 5 carbon atoms, nitrile group, alkoxycarbonyl group having 1 to 5 carbon atoms, acyl group having 1 to 5 carbon atoms, alkylsulfonyl group having 1 to 9 carbon atoms, arylsulfonyl group having 6 to 9 carbon atoms, alkylsulfinyl group having 1 to 9 carbon atoms, arylsulfinyl group having 6 to 9 carbon atoms, arylcarbonyl group having 6 to 9 carbon atoms, thiocarbonyl group, fluorine-containing alkyl group having 1 to 9 carbon atoms, fluorine-containing aryl group having 6 to 9 carbon atoms, fluorine-containing allyl group having 3 to 9 carbon atoms, oxo group, and halogen atoms.

Among the above groups, more preferably used are nitro group, fluoroalkyl group having 1 to 5 carbon atoms, nitrile group, alkoxycarbonyl group having 1 to 5 carbon atoms, acyl group having 1 to 5 carbon atoms, arylsulfonyl group having 6 to 9 carbon atoms, arylcarbonyl group having 6 to 9 carbon atoms, oxo group, and halogen atoms.

Specific examples of the compounds represented by formulas (L-I) and (L-II) are shown as follows. However, the lactone compounds for use in the present invention are not limited to the following examples.

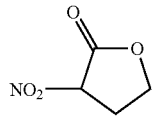

(LI-1)

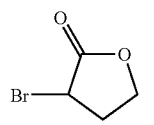 (LI-1)
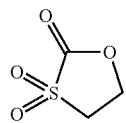 (LI-3)
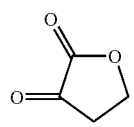 (LI-4)
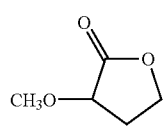 (LI-5)
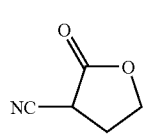 (LI-6)
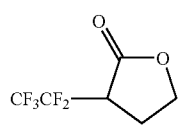 (LI-7)
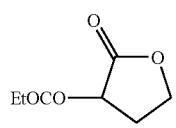 (LI-8)
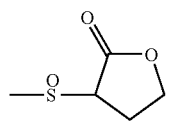 (LI-9)
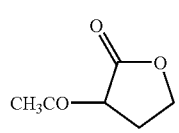 (LI-10)
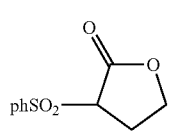 (LI-11)
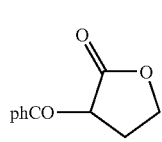 (LI-12)
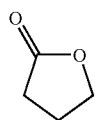 (LI-13)
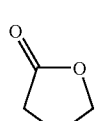 (LI-14)
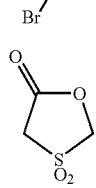 (LI-15)
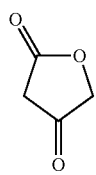 (LI-16)
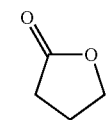 (LI-17)
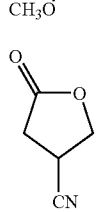 (LI-18)
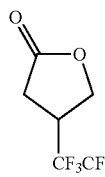 (LI-19)
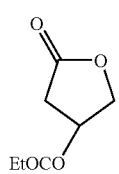 (LI-20)
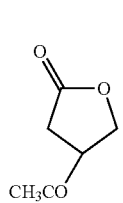 (LI-21)

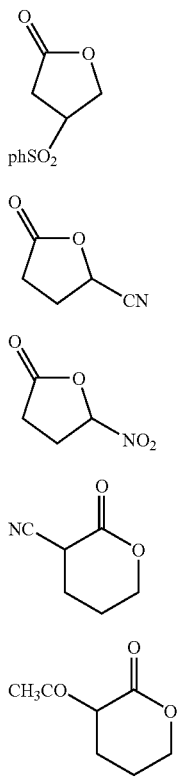

The lactone compound represented by formulas (L-I) and (L-II) may be contained in the image recording layer in an amount of 0.1 to 50% by weight from the aspect of satisfactory effect and image-forming performance, preferably 1 to 30% by weight, in terms of the solid content with respect to the total weight of the solid content of the image recording layer. It is desirable that the lactone compound be selectively brought into contact with the developing solution to cause the reaction therewith.

The above-mentioned lactone compounds may be used alone or in combination. Further, two or more kinds of lactone compounds having formula (L-I) and two or more kinds of lactone compounds having formula (L-II) may be used together at an arbitrary mixing ratio so that the total weight of the lactone compounds is within the above-mentioned range.

Material Which Can Be Pyrolytically Decomposed and Can Substantially Decrease the Solubility of the Alkali-soluble Polymer in the Alkaline Developing Solution Before Pyrolytical Decomposition Moreover, to further effectively inhibit the non-light exposed portion of the image recording layer from unfavorably dissolving in the developing solution, it is also preferable to use materials which can be pyrolytically decomposed and can substantially decrease the solubility of the alkali-soluble polymer in the alkaline developing solution before pyrolytical decomposition. Such materials include onium salts, o-quinonediazide compounds, aromatic sulfone compounds, and aromatic sulfonic acid ester compounds and the like. The onium salts include diazonium salt, ammonium salt, phosphonium salt, iodonium salt, sulfonium salt, selenonium salt, arsonium salt and the like.

More specifically, preferable examples of the onium salts are diazonium salts described in S. I. Schlesinger, Photogr. Sci. Eng., 18, 387 (1974), T. S. Bal et al., Polymer, 21, 423 (1980), and JP KOKAI No. Hei 5-158230; ammonium salts described in U.S. Pat. Nos. 4,069,055 and 4,069,056, and JP KOKAI No. Hei 3-140140; phosphonium salts described in D. C. Necker et al., Macromolecules, 17, 2468 (1984), C. S. Wen et al., Teh, Proc. Conf. Rad. Curing ASIA, p478 Tokyo, October (1988), and U.S. Pat. Nos. 4,069,055 and 4,069,056; iodonium salts described in J. V Crivello et al., Macromolecules, 10(6), 1307 (1977), Chem. & Eng. News, November. 28, p31 (1988), EP 104,143, U.S. Pat. Nos. 339,049 and 410,201, and JP KOKAI Nos. Hei 2-150848 and 2-296514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), EP 370,693, EP 233,567, EP 297,443, EP 297,442, U.S. Pat. Nos. 4,933,377, 3,902,114, 410,201, 339,049, 4,760,013, 4,734,444 and 2,833,827, and DP Nos. 2,904,626, 3,604,580 and 3,604,581; selenonium salts described in J. V. Crivello et al., Macromolecules, 10(6), 1307 (1977), and J. V. Crivello et al., J. Polymer Sci., Polymer Chem. Ed., 17, 1047 (1979); and arsonium salts described in C. S. Wen et al., Teh, Proc. Conf. Rad. Curing ASIA, p478 Tokyo, October (1988).

Of those onium salts, preferably used are diazonium salts, in particular, diazonium salts disclosed in JP KOKAI No. Hei 5-158230.

As the counter ions for the onium salts, tetrafluoroboric acid, hexafluorophosphoric acid, triisopropylnaphthalene-sulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, paratoluenesulfonic acid and the like can be employed. In particular, hexafluorophosphoric acid and alkyl aromatic sulfonic acid such as triisopropylnaphthalenesulfonic acid and 2,5-dimethylbenzenesulfonic acid are preferably used.

Suitable quinonediazide compounds for use in the present invention include o-quinonediazide compounds. The o-quinonediazide compound for use in the present invention is a compound having at least one o-quinonediazide group, which compound can exhibit increased alkali-solubility by pyrolysis. There can be employed o-quinonediazide compounds with various structures. The o-quinonediazide compounds herein used can contribute to the solubility characteristics of the image recording layer because the o-quinonediazide compounds have the characteristics that they lose the force to inhibit the binder agent from dissolving in the developing solution and the o-quinonediazide compounds themselves turns into alkali-soluble materials when thermally decomposed. For example, the o-quinonediazide compounds described in J. Kosar "Light-sensitive Systems" (John Wiley & Sons. Inc.) pp. 339–352 can be used in the present invention. In particular, sulfonic esters of o-quinonediazide compounds or sulfonamides obtained by the reaction with a variety of aromatic polyhydroxyl compounds or aromatic amino compounds are preferable. In addition, esters of benzoquinone-(1,2)-diazidesulfonic acid chloride or naphthoquinone-(1,2)-diazide-5-sulfonic acid chloride with pyrogallol-acetone resin as described in JP KOKOKU No. Sho 43-28403; and esters of benzoquinone-(1,2)-diazidesulfonic acid chloride or naphthoquinone-(1,2)-diazide-5-sulfonic acid chloride with phenol-formaldehyde resin as described in U.S. Pat. Nos. 3,046,120 and 3,188,210 are also preferably used in the present invention.

Similarly, esters of naphthoquinone-(1,2)-diazide-4-sulfonic acid chloride with phenol-formaldehyde resin or cresol-formaldehyde resin, and esters of naphthoquinone-(1,2)-diazide-4-sulfonic acid chloride with pyrogallol-acetone resin can also be preferably employed. Other suitable o-quinonediazide compounds are described in many patent specifications, for example, JP KOKAI Nos. Sho 47-5303, 48-63802, 48-63803, 48-96575, 49-38701 and 48-13354, JP KOKOKU Nos. Sho 41-11222, 45-9610 and 49-17481, U.S. Pat. Nos. 2,797,213, 3,454,400, 3,544,323, 3,573,917, 3,674,495 and 3,785,825, BP Nos. 1,227,602, 1,251,345, 1,267,005, 1,329,888 and 1,330,932, and DP No. 854,890.

It is preferable that the o-quinonediazide compound be contained in an amount of 1 to 50% by weight, more preferably 5 to 30% by weight, and most preferably 10 to 30% by weight, with respect to the total solid content of the image recording layer. The above-mentioned o-quinonediazide compounds may be used alone or in combination.

The image recording layer may further comprise the alkali-soluble resin wherein at least a part thereof is esterified, said resin being described in JP KOKAI No. Hei 11-288089.

To more effectively inhibit the alkali-soluble polymer from dissolving in the developing solution, and at the same time, to impart the increased scratch resistance to the surface portion of the image recording layer, it is preferable that the image recording layer further comprise polymers including a (meth)acrylate monomer having two or three perfluoroalkyl groups with 3 to 20 carbon atoms in the molecule thereof, as described in JP KOKAI No. 2000-187318. Such a polymer may be contained in an amount of 0.1 to 10% by weight, more preferably 0.5 to 5% by weight of the total weight of materials for the image recording layer.

Development Promoting Agent

The heat-sensitive layer of the PS plate may further comprise acid anhydrides, phenolics and organic acids to improve the sensitivity.

With respect to the acid anhydrides, cyclic acid anhydrides are preferable. More specifically, the cyclic acid anhydrides include phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenyl maleic anhydride, succinic anhydride, and pyromellitic anhydride disclosed in U.S. Pat. No. 4,115,128. Non-cyclic acid anhydrides include acetic anhydride.

Examples of the phenolics for use in the present invention are bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane.

The organic acids include sulfonic acids, sulfinic acids, alkylsulfuric acids, phosphonic acids, phosphoric esters, and carboxylic acids as described in JP KOKAI Nos. Sho 60-88942 and Hei 2-96755. Specific examples of the organic acids are p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

It is preferable that the above-mentioned acid anhydrides, phenolics and organic acids be contained in an amount of 0.05 to 20% by weight, more preferably 0.1 to 15% by weight, and most preferably 0.1 to 10% by weight, with respect to the total weight of the image recording layer.

Surfactant

The image recording layer may further comprise nonionic surfactants as described in JP KOKAI Nos. Sho 62-251740 and Hei 3-208514, ampholytic surfactants as described in JP KOKAI Nos. Sho 59-121044 and Hei 4-13149, siloxane compounds as described in EP 950,517, and copolymers comprising a fluorine-containing monomer as described in JP KOKAI Nos. Sho 62-170950, Hei 11-288093 and 2003-57820 to upgrade the coating properties and ensure the stable operation depending upon the development conditions.

Specific examples of the nonionic surfactants are sorbitan tristearate, sorbitan monopalmitate, sorbitan trioleate, stearic acid monoglyceride, and polyoxyethylene nonylphenyl ether. Specific examples of the ampholytic surfactants are alkyldi(aminoethyl)glycine, alkylpolyaminoethylglycine hydrochloride, 2-alkyl-N-carboxyethyl-N-hydroxyethyl imidazolinium betaine, and N-tetradecyl-N,N-betaine (e.g., "Amogen" (trade name) made by Dai-Ichi Kogyo Seiyaku Co., Ltd.).

Block copolymers of dimethyl siloxane and polyalkylene oxide are preferably employed as the siloxane compounds. More specifically, commercially available polyalkylene oxide modified silicone products such as "DBE-224", "DBE-621", "DBE-712", "DBP-732" and "DBP-534", made by Chisso Corporation; and "Tego Glide 100" (trade name), made by Tego Chemie Service GmbH can preferably be employed in the present invention.

It is preferable that the amount of the above-mentioned nonionic surfactants and ampholytic surfactants be in the range of 0.01 to 15% by weight, more preferably 0.1 to 5% by weight, and most preferably 0.05 to 0.5% by weight, with respect to the total weight of materials for the image recording layer.

Printing-out Agent/Coloring Agent

The image recording layer of the PS plate for use in the present invention may comprise a printing-out agent and a coloring agent for images such as a dye and a pigment to obtain visible images immediately after the image recording layer is heated by light exposure.

One of the representative examples of the printing-out agent is a combination of a compound capable of generating an acid when heated by light exposure and an organic dye capable of forming a salt together with the above-mentioned acid-generating compound. Examples of such a printing-out agent include the combination of o-naphthoquinonediazide-4-sulfonic acid halogenide with a salt-forming organic dye disclosed in JP KOKAI Nos. Sho 50-36209 and 53-8128, and the combination of a trihalomethyl compound with a salt-forming organic dye disclosed in JP KOKAI Nos. Sho 53-36223, 54-74728, 60-3626, 61-143748, 61-151644 and 63-58440. The above-mentioned trihalomethyl compound includes oxazole compounds and triazine compounds, both of which can exhibit excellent stability with time and produce clear printed-out images.

The coloring agent for forming image portions includes not only the above-mentioned salt-forming organic dyes, but also other dyes. Preferable dyes including the salt-forming organic dyes are classified into oil-soluble dyes and basic dyes. Specific examples of such dyes are Oil Yellow #101, Oil Yellow #103, Oil Pink #312, Oil Green BG, Oil Blue BOS, Oil Blue #603, Oil Black BY, Oil Black BS, and Oil Black T-505, which are made by Orient Chemical Industries, Ltd.; and Victoria Pure Blue, Crystal Violet Lactone, Crystal Violet (CI 42555), Methyl Violet (CI 42535), Ethyl Violet, Rhodamine B (CI 145170B), Malachite Green (CI 42000), and Methylene Blue (CI 52015). Dyes disclosed in JP KOKAI No. Sho 62-293247 are particularly preferable. Those dyes may be contained in an amount of 0.01 to 10% by weight, preferably 0.1 to 3% by weight, with respect to the total solid content of the image recording layer.

Plasticizer

The image recording layer of the PS plate for use in the present invention may further comprise a plasticizer, if necessary, to impart the flexibility and other properties to the image recording layer. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

Wax

The image recording layer of the PS plate for use in the present invention may further comprise a compound for decreasing the coefficient of static friction of the surface so as to improve the scratch resistance. More specifically, compounds having a long-chain alkylcarboxylic ester as described in U.S. Pat. No. 6,117,913 and JP KOKAI Nos. 2003-149799, 2003-302750 and 2004-12770 can be used as the wax.

Such a wax may be contained in an amount of 0.1 to 10% by weight, preferably 0.5 to 5% by weight, with respect to the total weight of the heat-sensitive layer.

The above-mentioned components are dissolved in a solvent to prepare a coating liquid for heat-sensitive layer, and then the coating liquid is applied to a suitable substrate so as to make a PS plate.

[Solvent Used for Coating Liquid for Heat-sensitive Layer]

Examples of the solvent used to prepare the coating liquids for the heat-sensitive layer include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water. The solvents for use in the present invention are not limited to the above-mentioned examples. Those solvents may be used alone or in combination.

When the image recording layer consists of an upper recording layer and a lower recording layer and these layers are provided adjacently, in selecting the solvents for preparation of the coating liquids, it is desirably considered that a solvent for coating the upper recording layer be selected substantially not to dissolve the lower recording layer in order to avoid the miscibility at the interface between the two layers. The concentration of the entire solid content of the components including the additives in the solvent may be preferably in the range of 1 to 50% by weight.

When an acid anhydride is used, the coating liquid has preferably water content of not more than 0.5% by weight.

[Amount of Coating]

The coating liquid for formation of the image recording layer may preferably be applied to the substrate for use in the PS plate with a deposition amount (solid amount) ranging from 0.3 to 3.0 g/m$^2$ from the aspect of the film properties and the printing durability. The amount is preferably from 0.5 to 2.5 g/m$^2$, and more preferably from 0.8 to 1.6 g/m$^2$.

[Layered Structure]

The PS plate used for the present invention is the one wherein the image recording layer comprising the above-mentioned components is provided on a substrate, and the image recording layer may have a layered structure consisting of at least two layers. Hereinafter, a case wherein the image recording layer consists of two layers of upper layer and lower layer is explained.

In this case, the alkali-soluble resin contained in the upper layer and the lower layer may be the one which is described above, and the alkali-soluble resin used in the upper layer is preferably less soluble in alkali than one used in the lower layer.

The IR-absorbing dye used in the each layer may be the same or different, and two or more IR-absorbing dyes may be used in the respective layer. The amount of the IR-absorbing dye in any one of the both layers is, as described above, from 0.01 to 50% by weight with respect to the total solid content of the layer to which the dye is added, preferably from 0.1 to 50% by weight, and more preferably from 0.1 to 30% by weight. In case that the IR-absorbing dye is added to the both layers, it is desirable that the total amount of the IR-absorbing dye is in the above range.

As to the materials which can be pyrolytically decomposed and can substantially decrease the solubility of the alkali-soluble polymer in the alkaline developing solution before pyrolytical decomposition, it is effective to involve this material in the lower layer, when the image recording layer has a layered structure, since this material may decompose partially with time. However, any of the upper layer and the lower layer may comprise this material, or the both layers may comprise this material. The amount of this material is as described above. When this material is incorporated into plural layers, the total of the amount thereof is preferably within the above range.

It is effective to use the lactone compound in the upper layer when the image recording layer has a layered structure. However, any of the upper layer and the lower layer, or the both layers may comprise the lactone compound.

[Substrate]

In the PS plate for lithographic printing for use in the present invention, any dimensionally stable plate-shaped materials with a required strength and durability can be used as the hydrophilic substrate. Preferably used are a sheet of paper; a laminated sheet prepared by covering paper with a thin layer of plastic, such as polyethylene, polypropylene or polystyrene; a metal plate made of, for example, aluminum, zinc or copper; a plastic film made of, for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal; and a sheet of paper or plastic film to which the above-mentioned metals are attached or deposited.

A polyester film and an aluminum plate are particularly preferable as the substrate for the PS plate in the present invention. In particular, the aluminum plate is most preferable because the dimensional stability is excellent and the cost is relatively low.

Aluminum plates substantially composed of pure aluminum or an aluminum alloy containing a trace amount of elements other than aluminum are suitable. In addition, plastic sheets to which the aluminum plate is attached or the aluminum is deposited are also preferable. Examples of the above-mentioned elements used in the aluminum alloys are silicon, iron, manganese, copper, magnesium, chromium, zinc, bismuth, nickel and titanium. The content of such elements for use in the aluminum alloy is at most 10% by weight.

Although the pure aluminum plates are particularly preferable for the substrate, production of perfectly pure aluminum is difficult from the viewpoint of the refining technique, so that a trace amount of different elements may be contained. In such a way, the composition of the aluminum plate is not particularly limited, and conventional aluminum plates may be appropriately used for the substrate of the PS plate in the present invention. The thickness of the aluminum plate serving as the substrate is within the range from about 0.1 to about 0.6 mm, preferably 0.15 to 0.4 mm, and more preferably 0.2 to 0.3 mm.

The aluminum plate may be first subjected to degreasing, if required, prior to the surface roughening treatment, using a surfactant, an organic solvent, or an aqueous alkaline solution to remove rolling oil from the surface of the aluminum plate.

To provide the aluminum plate with a grained surface, there can be used various methods, for example, a method of mechanically roughening the surface of the aluminum plate, a method of electrochemically dissolving the surface of the aluminum plate, and a method of chemically dissolving the selected portions of the aluminum plate surface. The mechanical graining includes conventional processes, such as ball graining, brush graining, blast graining, and buffing graining. The electrochemical graining can be carried out in an electrolytic solution such as a hydrochloric acid or nitric acid solution by the application of a direct current or alternating current. Moreover, the above-mentioned mechanical graining and electrochemical graining may be used in combination as disclosed in JP KOKAI No. Sho 54-63902.

The surface-grained aluminum plate thus obtained may be subjected to alkali etching, followed by neutralization. After that, an anodized film may usually be provided on the aluminum plate by anodization to improve the water retention properties and wear resistance.

Any material can be used as an electrolyte in the anodization of the aluminum plate so long as a porous anodized film can be formed on the surface of the aluminum plate. Typically, sulfuric acid, phosphoric acid, oxalic acid, chromic acid, and mixtures thereof are used as the electrolyte. The concentration of the electrolyte is appropriately determined depending upon the kind of electrolyte.

The operating conditions for the anodization cannot be particularly specified because they depend on the type of electrolyte. In general, it is proper that the concentration of the electrolyte be in the range of 1 to 80% by weight, the liquid temperature be controlled to 5 to 70° C., the current density be in the range of 5 to 60 A/dm$^2$, the applied voltage be in the range of 1 to 100 V, and the time for electrolysis be in the range of 10 seconds to 5 minutes. The deposition amount of the anodized film is suitably 1.0 g/m$^2$ or more, in the light of the sufficient printing durability, and prevention of toning by scratches on non-image areas.

After completion of the anodization, the surface of the aluminum plate may be made hydrophilic, if required. To make the aluminum surface hydrophilic, there can be employed an alkali metal silicate treatment (for example, using an aqueous solution of sodium silicate) as disclosed in U.S. Pat. Nos. 2,714,066, 3,181,461, 3,280,734 and 3,902,734. In such a silicate treatment, the aluminum substrate is immersed in an aqueous solution of sodium silicate or subjected to electrolysis therein. In addition to the silicate treatment, there can be employed other treatments using potassium fluorozirconate disclosed in JP KOKOKU No. Sho 36-22063 and polyvinylphosphonic acid disclosed in U.S. Pat. Nos. 3,276,868, 4,153,461, and 4,689,272.

The PS plate for lithographic printing for use in the present invention comprises a substrate and an image recording layer formed thereon. When necessary, the PS plate may further comprise an undercoating layer which is interposed between the substrate and the image recording layer.

A variety of organic compounds can be used for formation of the undercoating layer. Examples of such organic compounds include carboxymethyl cellulose; dextrin; gum arabic; organic phosphonic acids such as amino group-containing phosphonic acid (e.g., 2-aminoethyl phosphonic acid), phenylphosphonic acid which may have a substituent, naphthylphosphonic acid, alkylphosphonic acid, glycerophosphonic acid, methylenediphosphonic acid, and ethylenediphosphonic acid; organic phosphoric acids such as phenylphosphoric acid which may have a substituent, naphthylphosphoric acid, alkylphosphoric acid, and glycerophosphoric acid; organic phosphinic acids such as phenylphosphinic acid which may have a substituent, naphthylphosphinic acid, alkylphosphinic acid and glycerophosphinic acid; amino acids such as glycine and β-alanine; and hydrochlorides of hydroxyl group-containing amine, such as hydrochloride of triethanolamine. Those compounds may be used in combination.

An organic undercoating layer comprising at least one organic polymeric compound, which comprises repeating units represented by the following general formula may preferably be used as the foregoing undercoating layer:

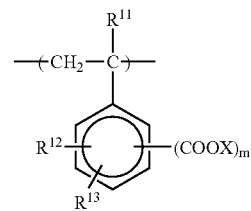

In the above formula, the substituent $R^{11}$ represents a hydrogen atom, a halogen atom or an alkyl group, the substituents $R^{12}$ and $R^{13}$ independently represent a hydrogen atom, a halogen atom, a hydroxyl group, an alkyl group, a substituted alkyl group, an aryl group, a substituted aryl group, —$OR^{14}$, —$COOR^{15}$, —$CONHR^{16}$, —$COR^{17}$ or —CN, the foregoing substituents $R^{12}$ and $R^{13}$ may be bonded together to form a ring structure. In this respect, the substituents $R^{14}$ to $R^{17}$ independently represent an alkyl group or an aryl group. X represents a hydrogen atom, a metal atom or —$NR^{18}R^{19}R^{20}R^{21}$, wherein the foregoing substituents $R^{18}$ to $R^{21}$ independently represent a hydrogen atom, an alkyl group, a substituted alkyl group, an aryl group or a substituted aryl group, provided that $R^{18}$ and $R^{19}$ may be bonded together to form a ring structure. m is an integer ranging from 1 to 3.

The organic undercoating layer can be provided by the following methods. The above-mentioned organic compound is dissolved in water or organic solvents such as methanol, ethanol, and methyl ethyl ketone, or a mixture of such solvents to prepare a coating liquid for forming the undercoating layer. The coating liquid thus prepared is coated on the aluminum plate and then dried, so that an undercoating layer can be provided on the aluminum substrate. Alternatively, an aluminum plate is immersed in the solution prepared by dissolving the above-mentioned organic compound in water or organic solvents such as methanol, ethanol, and methyl ethyl ketone, or a mixture of such solvents to cause the aluminum plate to absorb the compound. Thereafter, the coated surface is washed with water and dried, thereby obtaining an organic undercoating layer on the aluminum substrate. In the former method for providing the undercoating layer, the coating liquid containing the above-mentioned organic compound at concentrations ranging from 0.005 to 10% by weight can be applied to a variety of coating methods. In the latter method, the concentration of the organic compound in the coating liquid is preferably in the range of 0.01 to 20% by weight, more preferably in the range of 0.05 to 5% by weight. The aluminum plate may be immersed in the solution of 20 to 90° C., preferably 25 to 50° C., for 0.1 sec to 20 min, preferably 2 sec to 1 min. The coating liquid used to form the undercoating layer may be controlled to pH 1 to 12 by the addition of basic materials such as ammonia, triethylamine, potassium hydroxide and the like, or acidic materials such as hydrochloric acid, phosphoric acid and the like.

It is proper that the deposition amount of the undercoating layer be in the range of 2 to 200 mg/m$^2$ from the aspect of sufficient printing durability, and preferably in the range of 5 to 100 mg/m$^2$.

The heat-sensitive PS plate for lithographic printing thus fabricated is imagewise exposed to light and thereafter subjected to development using an alkaline developing solution.

The light source capable of emitting the active light for achieving the light exposure includes, for example, mercury lamp, metal halide lamp, xenon lamp, chemical lamp, and carbon arc lamp. The radiation includes electron beam, X-ray, ion beam, and far infrared ray, and the like. Further, g-line, i-line, deep-UV and high-density energy beam (laser beam) are also used. The laser beam includes helium-neon laser, argon laser, krypton laser, helium-cadmium laser, KrF excimer laser, and the like. In the present invention, the light sources for emitting the light of wavelengths within the range from the near infrared to infrared region are preferred. In particular, solid laser and semiconductor laser are preferable in the present invention.

[Alkaline Developing Solution used in the Invention]

The alkaline developing solution used in the present invention, which will also be hereinafter referred to as the developing solution simply, is an alkaline aqueous solution as a basic composition thereof, and it can appropriately be chosen from the conventional alkaline aqueous solutions.

The developing solutions used in the present invention include an alkaline aqueous solution comprising an alkali silicate or a nonreducing sugar and a base. The alkaline developing solutions having a pH range from 12.5 to 14.0 are particularly preferable.

The above-mentioned alkali silicate shows alkaline properties when dissolved in water. For example, silicates of alkali metals such as sodium silicate, potassium silicate and lithium silicate, and ammonium silicate can be used. Such alkali silicates may be used alone or in combination.

The developing performance of the alkaline aqueous solution comprising the above-mentioned alkali silicate can easily be controlled by adjusting the mixing ratio of the components constituting the silicate, that is, silicon dioxide ($SiO_2$) and alkali oxide represented by $M_2O$, wherein M is an alkali metal or ammonium group, and the concentration of the alkali silicate.

In the above-mentioned alkaline aqueous solution, it is preferable that the molar ratio of the silicon dioxide ($SiO_2$) to the alkali oxide ($M_2O$) be in the range of 0.5 to 3.0, from the aspect of moderate alkalinity and developing performance, and more preferably 1.0 to 2.0.

The concentration of the alkali silicate in the developing solution is preferably in the range of 1 to 10% by weight from the aspect of developing performance, processing ability and waste fluid treatment, more preferably 3 to 8% by weight, and most preferably 4 to 7% by weight, with respect to the total weight of the alkaline aqueous solution.

In the developing solution comprising a nonreducing sugar and a base, the nonreducing sugars mean sugars having no reducing properties due to the absence of free aldehyde group and ketone group. The nonreducing sugars are classified into trehalose type oligosaccharides prepared by linking reducing groups together, glycosides prepared by joining a reducing group of sugars with non-sugars, and sugar alcohols prepared by reducing sugars with hydrogenation. Any of the above-mentioned nonreducing sugars can preferably be used in the present invention.

The trehalose type oligosaccharides include, for example, saccharose and trehalose; and the glycosides include, for example, alkyl glycoside, phenol glycoside, and mustard oil glycoside.

Examples of the sugar alcohols are D, L-arabitol, ribitol, xylitol, D, L-sorbitol, D, L-mannitol, D, L-iditol, D, L-talitol, meso-inositol, dulcitol, and allodulcitol. Further, maltitol obtained by subjecting disaccharides to hydrogenation and reductants (e.g., reduced starch syrup) obtained by subjecting oligosaccharides to hydrogenation are also preferred.

Among the above-mentioned nonreducing sugars, trehalose type oligosaccharides and sugar alcohols, in particular, saccharose, D-sorbitol, meso-inositol and reduced starch syrup are preferably employed because there can be obtained a buffering action to lead to an adequate pH range.

Those nonreducing sugars may be used alone or in combination. The amount of the nonreducing sugar in the developing solution is preferably in the range of 0.1 to 30% by weight, more preferably 1 to 20% by weight.

The above-mentioned alkali silicate or nonreducing sugar can be used in combination with a base, which may appropriately be selected from the conventional alkaline chemicals, and a pH value of the developing solution can be adjusted.

Examples of the alkaline chemicals include inorganic alkaline agents such as sodium hydroxide, potassium hydroxide, lithium hydroxide, sodium tertiary phosphate, potassium tertiary phosphate, ammonium tertiary phosphate, sodium secondary phosphate, potassium secondary phosphate, ammonium secondary phosphate, sodium carbonate, sodium carbonate, potassium carbonate, ammonium carbonate, sodium bicarbonate, potassium bicarbonate, ammonium bicarbonate, sodium borate, potassium borate and ammonium borate, and potassium citrate, sodium citrate and the like.

In addition to the above, organic alkaline chemicals such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine can also be used.

Those alkaline chemicals may be used alone or in combination.

Among the above-mentioned alkaline chemicals which are suitable are sodium hydroxide and potassium hydroxide. By controlling the amount of the alkaline chemicals such as sodium hydroxide and potassium hydroxide with respect to the nonreducing sugar, the pH value of the developing solution can be determined within a wide range. Further, sodium tertiary phosphate, potassium tertiary phosphate, sodium carbonate and potassium carbonate are also preferable, since they have themselves, buffering action.

The alkaline developing solution used in the present invention further comprises at least one surfactant selected from the group consisting of anionic surfactants and amphoteric surfactants, in the above-mentioned alkaline aqueous solution.

[Anionic Surfactant]

Anionic surfactants which can be used in the present invention preferably include fatty alcohol sulfuric ester salts such as sodium lauryl alcohol sulfate, ammonium lauryl alcohol sulfate and sodium octyl alcohol sulfate, higher alkyl ether sulfate salts, aryl ether sulfate salts, alkyl aryl sulfonate salts such as sodium isopropyl naphthalene sulfonate, sodium isobutyl naphthalene sulfonate, sodium dodecyl benzene sulfonate, sulfuric esters of fatty alcohol having carbon atoms of from 8 to 22 such as sodium secondary alcohol sulfate, aliphatic alcohol phosphoric ester salts such as sodium cetyl alcohol phosphate, alkyl amide sulfonate salts such as $C_{17}H_{33}CON(CH_3)CH_2CH_2SO_3Na$, sulfonate salts of bibasic aliphatic ester such as dioctyl sodium sulfosuccinate and dihexyl sodium sulfosuccinate, hydroxyalkane sulfonate salts, alkane sulfonate salts, alkyl diphenylether sulfonate salts, diphenylether disulfonate salts, dialkyl sulfosuccinate salts, olefin sulfonate salts, linear alkyl benzene sulfonate salts, branched alkyl benzene sulfonate salts, alkyl naphthalene sulfonate salts, alkyl phenoxy polyoxyethylene propyl sulfonate salts, polyoxyethylene alkyl sulfophenylether salts, disodium N-alkyl sulfosuccinate monoamide, petroleum sulfonates, and the like.

Among these, preferred are aromatic anionic surfactants including the compounds represented by the following formula (I), (II), (III) or (IV).

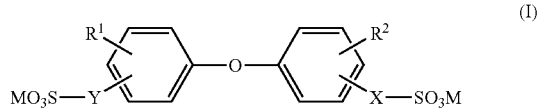
(I)

In the formula (I), $R^1$ and $R^2$ independently represent hydrogen atom or an alkyl group which may be in the form of linear or branched chain, X and Y independently represent a single bond or a formula: —O—$(CH_2CH_2O)n$- (n is an integer of from 1 to 100.), and M represents a monovalent alkali metal.

In the formula (I), an alkyl group represented by $R^1$ or $R^2$ has generally carbon atoms of from 1 to 40, preferably from 2 to 20, and more preferably from 4 to 12, and X and Y independently represent a single bond or a formula: —O—$(CH_2CH_2O)n$- (n is preferably an integer of from 2 to 50, and more preferably from 3 to 30.), and M represents generally sodium, potassium or lithium, and preferably sodium.

Preferable examples of the compounds represented by the formula (I) are the compounds represented by the following formula (1), (2) or (3).

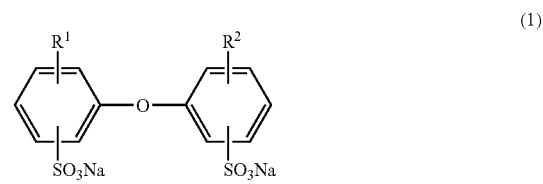
(1)

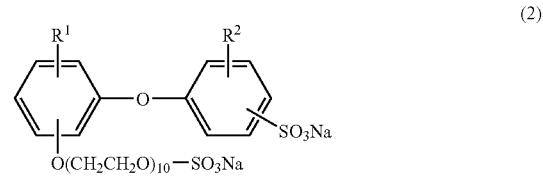
(2)

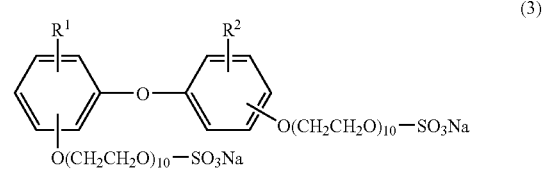
(3)

In the above formula (1), (2) or (3), specific example of $R^1$ or $R^2$ is particularly $nC_8H_{17}$ and $nC_{12}H_{25}$.

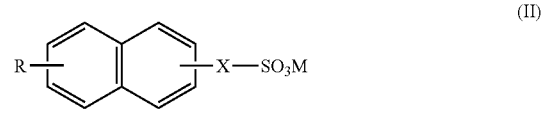
(II)

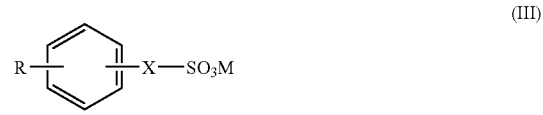
(III)

In the above formula (II) or (III), R represents hydrogen atom or an alkyl group which may be in the form of linear or branched chain, X represents a single bond or a formula : —O—$(CH_2CH_2O)n$- (n is an integer of from 1 to 100.), and M represents a monovalent alkali metal.

In the formula (II), an alkyl group represented by R has generally carbon atoms of from 1 to 40, preferably from 2 to 20, and more preferably from 4 to 12, and X represents a single bond or a formula: —O—$(CH_2CH_2O)n$- (n is preferably an integer of from 2 to 50, and more preferably from 3 to 30.), and M represents generally sodium, potassium or lithium, and preferably sodium.

Preferable examples of the compounds represented by the formula (II) are the compounds represented by the following formula (4) or (5).

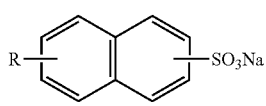 (4)

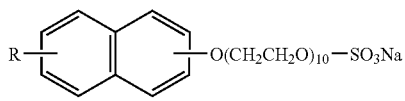 (5)

In the above formula (4) or (5), specific example of R is particularly $nC_8H_{17}$ and $nC_{12}H_{25}$.

In the formula (III), an alkyl group represented by R has generally carbon atoms of from 1 to 40, preferably from 2 to 20, and more preferably from 4 to 12, and X represents a single bond or a formula: —O—$(CH_2CH_2O)n$- (n is preferably an integer of from 2 to 50, and more preferably from 3 to 30.), and M represents generally sodium, potassium or lithium, and preferably sodium.

Preferable examples of the compounds represented by the formula (III) are the compounds represented by the following formula (6) or (7).

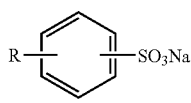 (6)

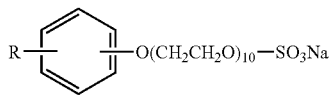 (7)

In the above formula (6) or (7), specific example of R is particularly $nC_8H_{17}$ and $nC_{12}H_{25}$.

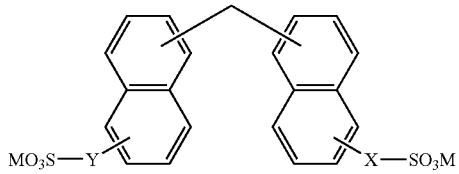 (IV)

In the formula (IV), X and Y independently represent a single bond or a formula: —O—$(CH2CH_2)n$- (n is an integer of from 1 to 100.), and M represents a monovalent alkali metal.

In the formula (IV), X and Y independently represent a single bond or a formula: —O—$(CH_2CH_2O)n$- (n is preferably an integer of from 2 to 50, and more preferably from 3 to 30.), and M represents generally sodium, potassium or lithium, and preferably sodium.

Preferable examples of the compounds represented by the formula (IV) are the compounds represented by the following formula (8), (9) or (10).

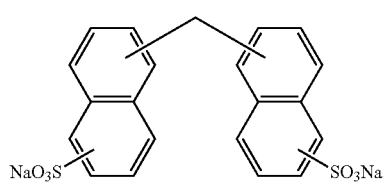 (8)

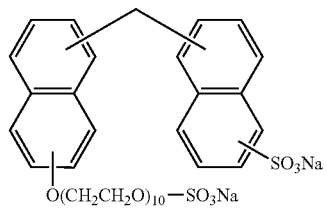 (9)

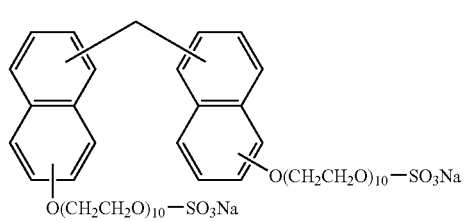 (10)

Among the compounds represented by the formulas (I)~(IV), the compounds represented by the formula (I) are preferable.

Specific examples of aromatic anionic surfactants are as follows.

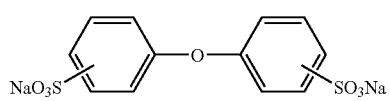 (A-1)

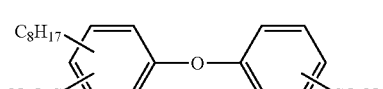 (A-2)

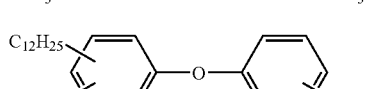 (A-3)

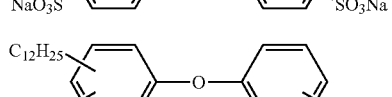 (A-4)

 (A-5)

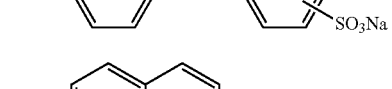 (A-6)

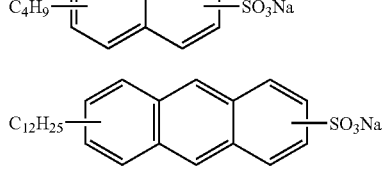 (A-7)

-continued

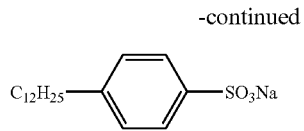

(A-8)

[Amphoteric Surfactant]

The amphoteric surfactant which can be used in the present invention includes amino acid-type amphoteric surfactants and betaine-type amphoteric surfactants, etc.

Examples of the amino acid-type amphoteric surfactants are compounds represented by the following formula (V) or (VI):

(V)

(VI)

wherein each $R^3$ and $R^4$ represents a hydrocarbon group having carbon atoms of from 2 to 30, and each R', R" and R''' represents a hydrogen atom or a monovalent alkali metal, and each m, n and p represents an integer of from 1 to 10.

In the above formula (V), $R^3$ represents preferably a hydrocarbon group having atoms of from 3 to 20 and preferably from 4 to 12, and generally an aliphatic hydrocarbon group which may be a straight chain or branched chain, preferably a straight chain, and may be saturated or unsaturated, and specifically an alkyl or alkenyl group. R' represents a hydrogen atom, or a monovalent alkali metal including sodium, potassium and lithium, preferably sodium. The symbol m represents an integer of from 1 to 10, preferably from 2 to 8 and more preferably from 2 to 6.

A preferred example of the compound represented by the formula (V) is the one represented by the following formula (11).

(11)

In the formula (11), the specific example of $R^3$ includes $nC_8H_{17}$, $nC_{12}H_{25}$ and the like.

In the formula (VI), $R^4$ represents preferably a hydrocarbon group having atoms of from 3 to 20 and preferably from 4 to 12, and generally an aliphatic hydrocarbon group which may be a straight chain or branched chain, preferably a straight chain, and may be saturated or unsaturated, and specifically an alkyl or alkenyl group. Each of R" and R''' represents a hydrogen atom, or a monovalent alkali metal including sodium, potassium and lithium, preferably sodium. The symbols n and p independently represent an integer of from 1 to 10, preferably from 2 to 8 and more preferably from 2 to 6.

A preferred example of the compound represented by the formula (VI) is the one represented by the following formula (12).

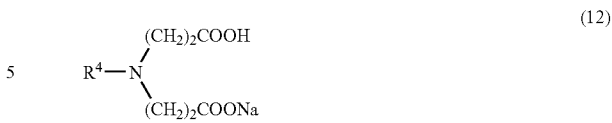

(12)

In the formula (12), the specific example of $R^4$ includes $nC_8H_{17}$, $nC12H_{25}$ and the like.

Among the compounds represented by the formula (V) or (VI), the one represented by the formula (VI) is preferable.

The above compounds may be prepared by a conventional method. Such compounds are also available in the market, for example, as a commercial product under a trade name of PIONIN C-158 manufactured by Takemoto Yushi, Co., Ltd.

On the other hand, examples of betaine-type amphoteric surfactants include the compounds represented by the following formula (VII):

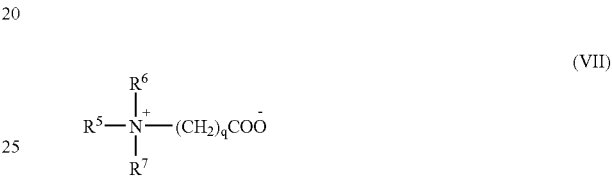

(VII)

wherein $R^5$, $R^6$ and $R^7$ independently represent a hydrocarbon group having carbon atoms of from 1 to 30, and q represents an integer of from 1 to 10.

In the formula (VII), $R^5$, $R^6$ and $R^7$ each represents preferably a hydrocarbon group having atoms of from 1 to 20 and preferably from 1 to 12, and generally an aliphatic hydrocarbon group which may be a straight chain or branched chain, preferably a straight chain, and may be saturated or unsaturated, and specifically an alkyl or alkenyl group. The symbol q represents an integer of from 1 to 10, preferably from 2 to 8 and more preferably from 2 to 6.

A preferred example of the compound represented by the formula (VII) is the one represented by the following formula (13).

(13)

In the formula (13), the specific example of $R^5$ includes $nC_8H_{17}$, $nC_{12}H_{25}$ and the like.

Other examples of the amphoteric surfactants include imidazolinium salts, imidazolines and sulfobetaines.

In the alkaline developing solution used in the present invention, any one compound or any combination of two or more compounds selected from the group consisting of anionic surfactants and amphoteric surfactants may be used. The amount of at least one surfactant selected from the group consisting of anionic surfactants and amphoteric surfactants in the alkaline developing solution ranges generally from 0.001 to 10% by weight, in the aspect of inhibiting occurrence of insoluble matter in the developing solution during the process of development and favorable developing performance. The amount is preferably from 0.005 to 1% by weight, and more preferably from 0.01 to 0.5% by weight.

The alkaline developing solution comprises an alkaline silicate or a nonreducing sugar, and a base, as described above. As the cationic component thereof, $Li^+$, $Na^+$, $K^+$ and $NH_4^+$ are conventionally used. In particular, a developing solution system comprising lot of the cation which has a small ionic radius is highly penetrative to an image recording layer, such system being excellent in developing performance, however, the system also dissolves the image area and causes impairment of the image. Accordingly, the increase of alkaline concentration should be limited to a certain extent, and it is in need of setting of subtle liquid condition in order that simultaneously impairment of the image and the image recording layer which is left on non-image areas (undissolved residue) may not be generated.

However, the use of cation which has relatively large ionic radius in a developing solution inhibits the penetration of developing solution into an image recording layer, and so it is possible to improve an inhibitive power against the solubility of image areas without decrease of alkaline concentration, i.e., without decrease of the developing performance.

As the cationic component, other cations than alkaline metal cations and ammonium cation may be used.

The alkaline developing solution may further comprise various additives as shown below in order to enhance the developing performance more effectively.

The additives include, for example, a neutral salt such as NaCl, KCl and KBr as disclosed in JP KOKAI No. Sho 58-75152, a chelating agent such as EDTA and NTA as disclosed in JP KOKAI No. Sho 58-190952; a complex such as $[Co(NH_3)_6]Cl_3$ and $CoCl_2.6H_2O$ as disclosed in JP KOKAI No. Sho 59-121336; anion or amphoteric surfactants such as sodium alkyl naphthalene sulfonate, N-tetradecyl-N,N-dihydroxyethyl betaine and the like as disclosed in JP KOKAI No. Sho 50-51324; a nonionic surfactant such as tetramethyldecyne diol as disclosed in U.S. Pat No. 4,374,920; a cationic polymer such as methyl chloride quaternary compounds of p-dimethylaminomethyl polystyrene as disclosed in JP KOKAI No. Sho 55-95946; a polymeric ampholyte such as a copolymer of vinylbenzyltrimethylammonium chloride and sodium acrylate as disclosed in JP KOKAI No. Sho 56-142528; a reducing inorganic salt such as sodium sulfite as disclosed in JP KOKAI No. Sho 57-192951; an inorganic lithium compound such as lithium chloride as disclosed in JP KOKAI No. Sho 58-59444; an organic metal-containing surfactant such as surfactants containing organic silicon or titanium as disclosed in JP KOKAI No. Sho 59-75255; an organic boron compound as disclosed in JP KOKAI No. Sho 59-84241; and a quaternary ammonium salt such as tetraalkylammonium oxide as disclosed in EP 101,010.

The embodiment where the alkaline developing solution is used in the plate making method according to the present invention is not particularly limited. To rationalize and standardize the process of making a printing plate in the fields of plate making and printing, automatic processors have widely been used to produce printing plates in recent years. Typically, the automatic processor comprises a development unit and a post-treatment unit, including an apparatus for transporting a PS plate, containers for various kinds of treatment liquids, and apparatuses for spraying the liquids onto the PS plate. While the PS plate that has been exposed to light image is horizontally transported in the automatic processor, each treatment liquid is drawn up from the container using a pump and sprayed onto the PS plate through the spray nozzle, thereby achieving the development. There is also known a method of treating the PS plate by immersing the PS plate in a treatment liquid held in the container while transporting the PS plate along a guide roll provided in the container.

Such an automatic processor can achieve continuous development operation by replenishing the treatment liquids in respective containers according to the amount consumed and the operating time. In this case, large quantities of PS plates can be treated without any replacement of the developing solution in a developer container over a long period of time by adding to the developing solution a replenisher controlled to have an alkalinity higher than that of the developing solution. In the embodiments where the alkaline developing solution is used in the plate making method of the present invention, the above-mentioned replenishing system is preferably used. Basically, the replenisher may have the same formulation as that of the alkaline developing solution mentioned above, and the replenisher may have a higher alkalinity than those of the developing solution. Not only the above-mentioned development process, but also the development process using only a substantially fresh developing solution, that is, a throwaway developing solution, can be applied to the method of making a printing plate according to the present invention.

The aforementioned developing solution and replenisher therefor may further comprise diverse surfactants and organic solvents, if necessary, in order to appropriately control the developing performance, enhance the dispersion properties of sludge in the developing solution, and increase the ink receptivity of the image portion to be formed in the printing plate.

Such surfactant may be selected from nonionic, cationic, anionic or amphoteric surfactants other than those described above. Examples of nonionic surfactants include polyethylene glycols such as polyethylene glycol, polyethylene glycol-polypropylene glycol block copolymer and the like; polyethylene glycol alkyl ethers such as polyethylene glycol cetyl ether, polyethylene glycol stearyl ether, polyethylene glycol oleyl ether, polyethylene glycol behenyl ether and the like; polyethylene glycol polypropylene glycol alkyl ethers such as polyethylene glycol polypropylene glycol cetyl ether, polyethylene glycol polypropylene glycol decyl tetradecyl ether and the like; polyethylene glycol alkylphenyl ethers such as polyethylene glycol octylphenyl ether, polyethylene glycol nonylphenyl ether and the like; ethylene glycol fatty acid esters such as ethylene glycol monostearate, ethylene glycol distearate, diethylene glycol stearate, polyethylene glycol distearate, polyethylene glycol monolaurate, polyethylene glycol monostearate, polyethylene glycol monooleate and the like; glyceryl fatty acid esters such as glyceryl monomyristate, glyceryl monostearate, glyceryl monoisostearate, glyceryl distearate, glyceryl monooleate, glyceryl dioleate and the like, and polyethylene oxide adduct thereof; sorbitan fatty acid esters such as sorbitan monopalmitate, sorbitan monostearate, sorbitan tristearate, sorbitan monooleate, sorbitan trioleate and the like, and polyethylene oxide adduct thereof, sorbitol fatty acid esters such as sorbitol monolaurate, sorbitol tetrastearate, sorbitol hexastearate, sorbitol tetraoleate and the like, and polyethylene oxide adduct thereof, and polyethylene oxide adduct of caster oil.

Benzyl alcohol or the like is preferred as the above-mentioned organic solvent. In addition, it is also preferable to add polyethylene glycol or derivatives thereof, and polypropylene glycol or derivatives thereof.

Furthermore, when necessary, the developing solution and replenisher may comprise hydroquinone, resorcin, an inorganic salt type reducing agent such as sodium sulfite or hydrogensulfite and potassium sulfite or hydrogensulfite, an organic carboxylic acid, an antifoaming agent, and a water softener.

The PS plate which has undergone development process with the alkaline developing solution and replenisher is subjected to water washing and/or rinsing and/or gumming up. In the case where the resultant PS plate bears an image portion that needs deleting, the unnecessary image portion may be deleted by, for example, applying a correction fluid as described in JP KOKOKU No. Hei 2-13293 to the unnecessary image portion and washing the portion with water after a predetermined period of time. Although the above-mentioned method is preferable, another method as described in JP KOKAI No. Sho 59-174842 can also be employed, by which method the active light guided along an optical fiber is applied to the unnecessary image portion, followed by development.

A desensitizing gum may be coated on the lithographic printing plate obtained in the above manner, if necessary, before printing operation. When the printing plate is required to have higher printing durability, the printing plate may be subjected to a burning treatment. In this case, it is desirable to treat the printing plate with a liquid for counter-etching as described in JP KOKOKU Nos. Sho 61-2518 and 55-28062, and JP KOKAI Nos. Sho 62-31859 and 61-159655 prior to the burning treatment.

For the treatment of the printing plate with a counter-etch solution, the counter-etch solution may be coated on the printing plate using a sponge or absorbent cotton dampened with the counter-etch solution, or the printing plate may be immersed in the counter-etch solution held in a vat. Further, an automatic coater may be used. After completion of the coating, the coating amount may be made uniform by using a squeegee or squeezing roller to produce more favorable results.

It is proper that the counter-etch solution be coated on the printing plate in a coating amount of 0.03 to 0.8 g/m² on a dry basis. The printing plate thus coated with the counter-etch solution is dried, and thereafter heated to high temperatures in a burning processor such as a commercially available burning processor "BP-1300" made by Fuji Photo Film Co., Ltd., if necessary. In this case, the heating temperature and the heating time, which vary depending upon the kinds of components constituting the image portion of the printing plate, may preferably be controlled within the range of 180 to 300° C. and 1 to 20 minutes, respectively.

After the burning treatment, the printing plate may appropriately be subjected to the conventional treatments such as water washing, gumming up and the like. When the printing plate has been treated with a counter-etch solution comprising a water-soluble polymer compound, the step of desensitization including gumming up may be omitted. The lithographic printing plate thus obtained can be set in an offset press to produce large numbers of printed matters.

Other features of this invention will become apparent in the course of the following description of exemplary embodiments, which are given for illustration of the invention and are not intended to be limiting thereof.

EXAMPLES

The present invention will hereinafter be explained in more detail with reference to the following non-limitative working Examples.

<Preparation of PS Plate (1)>

An aluminum plate of 0.3 mm thickness (grade 1050) was washed with trichloroethylene to be degreased, and surface-grained with a nylon brush and an aqueous suspension of 400 mesh pumice stone, and then sufficiently washed with water. The aluminum plate was then subjected to an immersed-electrolytic etching in a 25% aqueous solution of sodium hydroxide at 45° C. for 9 seconds, washed with water, and further immersed in a 20% aqueous solution of nitric acid for 20 seconds, and washed with water. The etching amount of grained surface was about 3 g/m². Then it was anodized in a 7% aqueous solution of sulfuric acid at a DC current density of 15 A/dm² so that the thickness of the resulting anodized layer was 3 g/m², washed with water, and then dried. Thereafter, the aluminum plate was treated with a 2.5% aqueous solution of sodium silicate at 30° C. for 10 seconds, coated with the following coating solution 1 of undercoating layer, and dried under 80° C. for 15 seconds to obtain a substrate. The coated amount of the undercoating layer after drying was 15 mg/m².

| [Coating Solution 1 of Undercoating Layer] | |
| --- | --- |
| Copolymer represented by the formula below (molecular weight: 28,000) | 0.3 g |
| Methanol | 100 g |
| Water | 1 g |

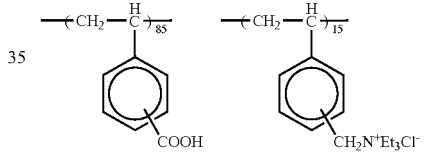

The following coating solution of image recording layer was applied onto the surface of the aluminum substrate obtained above and dried in an amount of 1.5 g/m² (weighed after drying) to obtain PS plate (1).

In the composition of the following coating solution, novolak resin 1 used has the following properties of molar ratio of monomer components, weight-average molecular weight, and amount of unreacted monomer.

Novolak resin 1:

2,3-xylenol/m-cresol/p-cresol (10/40/50),

Mw: 8000, and not more than 2% by weight of unreacted monomers.

| [Coating solution of Image recording Layer] | |
| --- | --- |
| Novolak resin 1 | 1.0 g |
| Cyanine dye A represented by the formula below | 0.1 g |
| Phthalic anhydride | 0.05 g |
| P-toluene sulfonic acid | 0.002 g |
| Ethylviolet provided that counter ion is 6-hydroxy-β-naphthalene sulfonic acid | 0.02 g |
| Fluorine atom-containing surfactant (trade name of Megaface-177 manufacture by Dainippon Ink and Chemicals, Inc.) | 0.05 g |

-continued

[Coating solution of Image recording Layer]

| Methyl ethyl ketone | 8 g |
| 1-Methoxy-2-propanol | 4 g |

Cyanine dye A

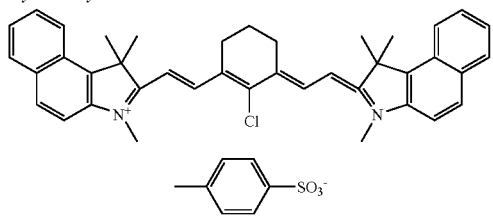

<Preparation of PS Plate (2)>

[Synthesis of Copolymer 1]

To a 500 ml volume three-necked flask equipped with a stirring machine, a cooling tube and a dropping funnel, there were added 31.0 g (0.36 mole) of methacrylic acid, 39.1 g (0.36 mole) of ethyl chloroformate and 200 ml of acetonitrile and then the resulting mixture was stirred while cooling it in an ice-water bath. To this mixture, there was dropwise added 36.4 g (0.36 mole) of triethylamine through the dropping funnel over about one hour. After the completion of the dropwise addition, the ice-water bath was removed and the mixture was stirred at room temperature for 30 minutes. To this reaction mixture, there was added 51.7 g (0.30 mole) of p-aminobenzene sulfonamide and the resulting mixture was stirred over one hour while warming the mixture at 70° C. in an oil bath. After the completion of the reaction, the mixture was introduced into 1 L of water while stirring the water and the resulting mixture was stirred for 30 minutes. This mixture was filtered to recover the precipitates, followed by addition of 500 ml of water to the precipitates to give a slurry, filtration of the slurry and drying the resulting solid to give N-(p-aminosulfonylphenyl)methacrylamide as a white solid (yield 46.9 g).

Then there were added 4.61 g (0.0192 mole) of N-(p-aminosulfonylphenyl)methacrylamide, 2.94 g (0.0258 mole) of ethyl methacrylate, 0.80 g (0.015 mole) of acrylonitrile and 20 g of N,N-dimethyl acetamide to a 20 ml volume three-necked flask equipped with a stirring machine, a cooling tube and a dropping funnel, followed by stirring the resulting mixture while heating it to 65° C. in a hot water bath. To this mixture, there was added 0.15 g of "V-65" (available from WAKO Pure Chemical Co., Ltd.) and then the mixture was stirred in a nitrogen gas stream for 2 hours while retaining the same at 65° C. To this reaction mixture, there was further dropwise added a mixture comprising 4.61 g of N-(p-aminosulfonylphenyl)methacrylamide, 2.94 g of ethyl methacrylate, 0.80 g of acrylonitrile, N,N-dimethyl acetamide and 0.15 g of "V-65" through the dropping funnel over 2 hours. After the dropwise addition of the mixture, the resulting mixture was additionally stirred at 65° C. for 2 hours. After the completion of the reaction, 40 g of methanol was added to the reaction mixture, followed by cooling the mixture, introduction of the resulting mixture into 2 L of water while stirring the water, stirring the mixture over 30 minutes, filtration of the reaction mixture to remove precipitates thus formed and then drying the precipitates to give 15 g of a white solid. The weight-average molecular weight (polystyrene standard) of the specific copolymer was determined by the gel permeation chromatography and it was found to be 54,000.

[Preparation of Substrate]

An aluminum plate of 0.3 mm thickness (grade 1050) was washed with trichloroethylene to be degreased, and surface-grained with a nylon brush and an aqueous suspension of 400 mesh pumice stone, and then sufficiently washed with water. The aluminum plate was then subjected to an immersed-electrolytic etching in a 25% aqueous solution of sodium hydroxide at 45° C. for 9 seconds, washed with water, and further immersed in a 20% aqueous solution of nitric acid for 20 seconds, and washed with water. The etching amount of grained surface was about 3 g/m$^2$. Then it was anodized in a 7% aqueous solution of sulfuric acid at a DC current density of 15 A/dm$^2$ so that the thickness of the resulting anodized layer was 3 g/m$^2$, washed with water, and then dried. Thereafter, the aluminum plate was treated with a 2.5% aqueous solution of sodium silicate at 30° C. for 10 seconds, coated with the above coating solution 1 of undercoating layer, and dried under 80° C. for 15 seconds to obtain a substrate. The coated amount of the undercoating layer after drying was 15 mg/m$^2$.

The following coating solution of image recording layer was prepared, and the same was applied onto the surface of the aluminum substrate obtained above, and dried under 150° C. for 30 seconds in an amount of 1.2 g/m$^2$ (weighed after drying) to obtain PS plate (2).

In the composition of the following coating solution, novolak resin 2 used has the following properties of molar ratio of monomer components, weight-average molecular weight, and amount of unreacted monomer.

Novolak resin 2:

3,5-xylenol/m-cresol/p-cresol (10/40/50),

Mw: 8000, and not more than 2% by weight of unreacted monomers.

[Coating solution of Image recording Layer]

| Fluorine atom-containing polymer represented by the formula below | 0.03 g |
| Copolymer 1 | 0.75 g |
| Novolak resin 2 | 0.25 g |
| P-toluene sulfonic acid | 0.003 g |
| Tetrahydrophthalic anhydride | 0.03 g |
| Pyrylium dye B represented by the formula below | 0.017 g |
| Victoria pure blue BOH provided that counter ion is 1-naphthalene sulfonic acid anion | 0.015 g |
| 3-methoxy-4-diazodiphenylamine hexafluorophosphate | 0.02 g |
| Normal-dodecyl stearate | 0.03 g |
| Fluorine atom-containing surfactant (trade name of Megaface-177 manufacture by Dainippon Ink and Chemicals, Inc.) | 0.05 g |
| γ-butyrolactone | 10 g |
| Methyl ethyl ketone | 10 g |
| 1-Methoxy-2-propanol | 8 g |

-continued

[Coating solution of Image recording Layer]

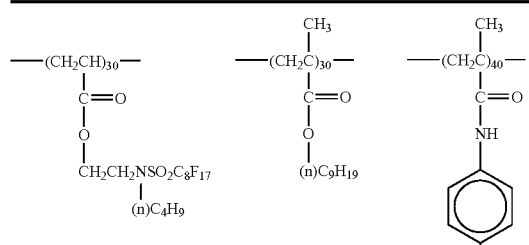

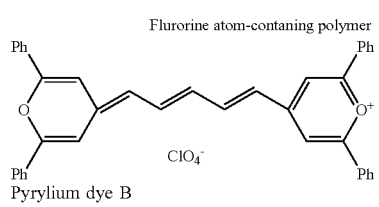
Pyrylium dye B

<Preparation of PS Plate (3)>

[Preparation of Substrate]

An aluminum plate of 0.3 mm thickness (grade 1050) was washed with trichloroethylene to be degreased, and surface-grained with a nylon brush and an aqueous suspension of 400 mesh pumice stone, and then sufficiently washed with water. The aluminum plate was then subjected to an immersed-electrolytic etching in a 25% aqueous solution of sodium hydroxide at 45° C. for 9 seconds, washed with water, and further immersed in a 20% aqueous solution of nitric acid for 20 seconds, and washed with water. The etching amount of grained surface was about 3 g/m$^2$. Then it was anodized in a 7% aqueous solution of sulfuric acid at a DC current density of 15 A/dm$^2$ so that the thickness of the resulting anodized layer was 3 g/m$^2$, washed with water, and then dried. The above coating solution 1 of undercoating layer was then applied thereon, dried under 90° C. for 1 minute, and the coated amount of the undercoating layer after drying was 10 mg/m$^2$.

The following coating solution A of image recording layer was applied onto the substrate obtained above, and dried under 100° C. for 2 minutes to form a lower image recording layer. The coated amount of the lower image recording layer after drying was 1.3 g/m$^2$. Then the following coating solution B of image recording layer was applied thereon, and dried under 100° C. for 2 minutes to form an upper image recording layer, resulting in PS plate (3). The total amount of the coating solutions A and B for image recording layer applied was 1.8 g/m$^2$ after drying. The novolak resin 1 in the coating solution B of image recording layer was the same as the above mentioned novolak resin 1.

| [Coating solution A of Image recording Layer] | |
|---|---|
| Copolymer 1 | 0.75 g |
| Cyanine dye A | 0.04 g |
| P-toluene sulfonic acid | 0.002 g |
| Tetrahydrophthalic anhydride | 0.05 g |
| Victoria pure blue BOH provided that counter ion is 1-naphthalene sulfonic acid anion | 0.015 g |
| Fluorine atom-containing surfactant (trade name of MegafacF-177 manufacture by Dainippon Ink and Chemicals, Inc.) | 0.02 g |
| γ-butyrolactone | 8 g |
| Methyl ethyl ketone | 7 g |
| 1-Methoxy-2-propanol | 7 g |
| [Coating solution B of Image recording Layer] | |
| Novolak resin 1 | 0.25 g |
| Pyrylium dye B | 0.05 g |
| Normal-dodecyl stearate | 0.02 g |
| Fluorine atom-containing surfactant (trade name of MegafacF-177 manufacture by Dainippon Ink and Chemicals, Inc.) | 0.05 g |
| Methyl ethyl ketone | 7 g |
| 1-Methoxy-2-propanol | 7 g |

<Preparation of Developing Solution>

[Preparation of SiO$_2$-containing Alkaline Developing Solution]

SiO$_2$-containing alkaline developing solutions were prepared as follows. Diverse compounds a to z shown below, each was added at various concentrations summarized in the following Table 1 to one liter of an aqueous solution comprising 4.0% by weight of potassium silicate whose molar ratio of SiO$_2$/K$_2$O was 1.1 to obtain developing solutions (1) to (30). For comparison, the above aqueous solution comprising 4.0% by weight of potassium salt whose molar ratio of SiO$_2$/K$_2$O was 1.1 was referred to as developing solution (61).

[Preparation of Nonreducing Sugar Containing Alkaline Developing Solution]

Nonreducing sugar-containing alkaline developing solutions were prepared as follows. Diverse compounds a to z shown below, each was added at various concentrations summarized in the Table 1 to one liter of an aqueous solution comprising 5.0% by weight of potassium salt consisting of a combination of a nonreducing sugar and a base: D-sorbitol/potassium oxide K$_2$O to obtain developing solutions (31) to (60). For comparison, the above aqueous solution comprising 5.0% by weight of potassium salt consisting of a combination of a nonreducing sugar and a base: D-sorbitol/potassium oxide K$_2$O was referred to as developing solution (62).

Compound a to z:

a:

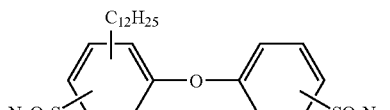

b:

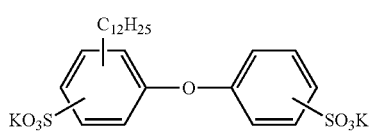

-continued
c: 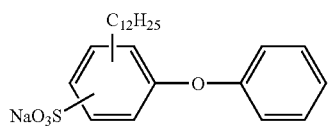
d: 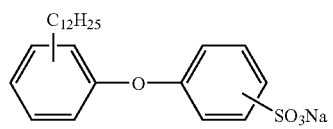
e: 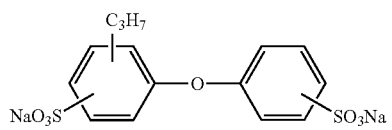
f: 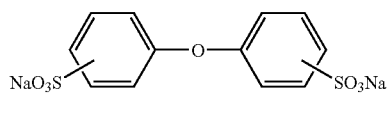
g: 
h: 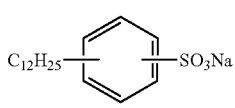
i: 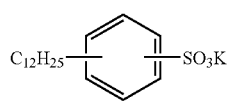
j: 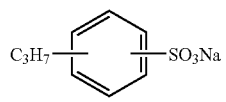
k: 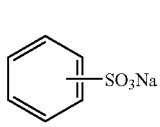
l: 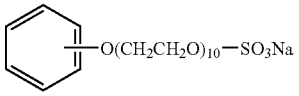
m: 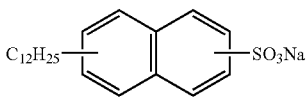
n: 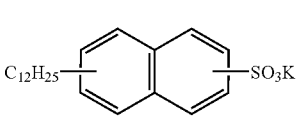
-continued
o: 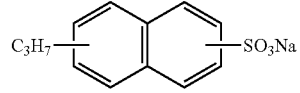
p: 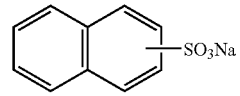
q: 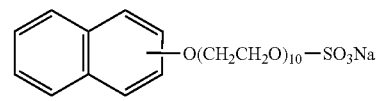
r: 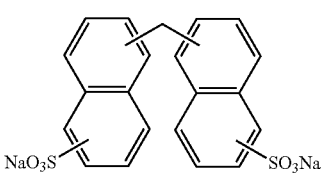
s: 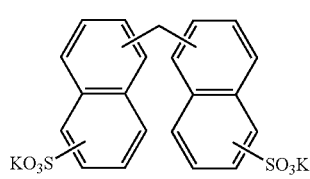
t: 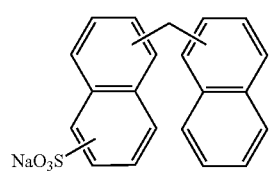
u: 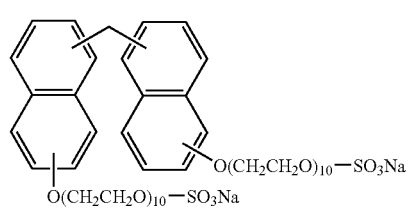
v: $C_{12}H_{25}OSO_3Na$
w: 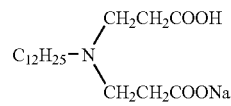
x: $C_{12}H_{25}NHCH_2CH_2COONa$
y: 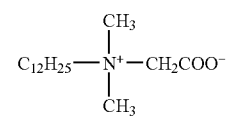

-continued z:

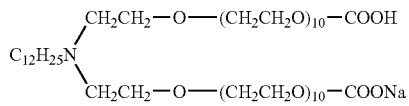

TABLE 1

| SiO$_2$-containing Developing Solution No. | Compounds a~z | Concentration (g/liter) | Non-reducing sugar-containing Developing Solution No. | Compounds a~z | Concentration (g/liter) |
|---|---|---|---|---|---|
| (1) | a | 0.01 | (31) | A | 0.01 |
| (2) | a | 0.1 | (32) | A | 0.1 |
| (3) | a | 1.0 | (33) | A | 1.0 |
| (4) | a | 10.0 | (34) | A | 10.0 |
| (5) | a | 100.0 | (35) | A | 100.0 |
| (6) | b | 1.0 | (36) | B | 1.0 |
| (7) | c | 1.0 | (37) | C | 1.0 |
| (8) | d | 1.0 | (38) | D | 1.0 |
| (9) | e | 1.0 | (39) | E | 1.0 |
| (10) | f | 1.0 | (40) | F | 1.0 |
| (11) | g | 1.0 | (41) | G | 1.0 |
| (12) | h | 1.0 | (42) | h | 1.0 |
| (13) | i | 1.0 | (43) | i | 1.0 |
| (14) | j | 1.0 | (44) | j | 1.0 |
| (15) | k | 1.0 | (45) | k | 1.0 |
| (16) | l | 1.0 | (46) | l | 1.0 |
| (17) | m | 1.0 | (47) | m | 1.0 |
| (18) | n | 1.0 | (48) | n | 1.0 |
| (19) | o | 1.0 | (49) | o | 1.0 |
| (20) | p | 1.0 | (50) | p | 1.0 |
| (21) | q | 1.0 | (51) | q | 1.0 |
| (22) | r | 1.0 | (52) | r | 1.0 |
| (23) | s | 1.0 | (53) | s | 1.0 |
| (24) | t | 1.0 | (54) | t | 1.0 |
| (25) | u | 1.0 | (55) | u | 1.0 |
| (26) | v | 1.0 | (56) | v | 1.0 |
| (27) | w | 1.0 | (57) | w | 1.0 |
| (28) | x | 1.0 | (58) | x | 1.0 |
| (29) | y | 1.0 | (59) | y | 1.0 |
| (30) | z | 1.0 | (60) | z | 1.0 |
| (61) | — | — | (62) | — | — |

Examples 1 to 60 and Comparative Examples 1 and 2

Examples 1 to 60 were carried out by using developing solutions (1) to (60), respectively, to process PS plate (1), and Comparative Examples 1 and 2 were carried out by using developing solutions (61) and (62), respectively, to process PS plate (1).

PS plate (1) was light-exposed using a semiconductor laser with an output power of 500 mW, a wave length of 830 nm and a beam diameter of 17 μm(1/e$^2$) at a horizontal scanning speed of 5 m/sec, and maintained at 25° C.

The PS plate thus treated was processed by an automatic processor, PS900NP (manufactured by Fuji Photo Film Co., Ltd.) filled up with the above each developing solution, at a development temperature of 30° C. for 12 seconds. The plate was processed in the above processor at throughput of 50, 100, 200, 300, 400 and 500 m$^2$ without supplement of replenisher. After the development procedure, the plate was washed with water and treated with a gum solution (two-fold dilution of GU-7 manufactured by Fuji Photo Film Co., Ltd.) so as to obtain a lithographic printing plate.

<Evaluation on Balance of Image Area/Non-image Area>

[Evaluation on Development of Non-image Area]

Development effect on the non-image areas of the above lithographic printing plate obtained at immediately after the start of processing, and at the time of throughput of 50, 100, 200, 300, 400 and 500 m$^2$ plate was visually determined by observing undissolved residue on non-image areas. In addition, toning on a printed matter was also evaluated. The results were shown in Tables 2 and 3.

Criteria:

◯: The non-image areas were sufficiently developed and there was observed no residue of the image recording layer on the non-image areas.

Toning on the printed matter was not observed.

Δ: The image recording layer was left slightly on the non-image areas. Toning on the printed matter was not observed.

x: Failure of development was observed, and the image recording layer was left on the non-image areas. Toning on the printed matter was observed.

[Evaluation of Impairment of Image Area]

Impairment of the image areas of the above lithographic printing plate obtained at immediately after the start of processing, and at the time of throughput of 50, 100, 200, 300, 400 and 500 m$^2$ plate was visually determined. The results were shown in Tables 4 and 5.

Criteria:

◯: There was observed no impairment in the image areas. Color defect of the image areas on the printed matter was not observed.

ΔA: Image density was slightly decreased, and the impairment of the image areas was partially observed. Color defect of the image areas on the printed matter was not observed.

x: Image density was largely decreased, and the impairment of the image areas was partially observed. Color defect of the image areas on the printed matter was observed.

<Insoluble Matter in Developing Solution>

The developing solution which had been used in the processing of 1 m$^2$, 10 m$^2$ or 100 m$^2$ plate per one litter was left in a refrigerator at 5° C., at room temperature of from 20 to 25° C., or in a thermostatic chamber at 35° C. for one month, and then the insoluble matter in the developing solution was observed. The results were shown in Tables 6 and 7.

Criteria

◯: There was no insoluble matter.

Δ: There was slightly insoluble matter, but the insoluble matter was dissolved and eliminated by shaking.

x: There was insoluble matter, even if the developing solution was shaken.

TABLE 2

| Example No. | SiO₂-containing Developing Solution No. | Development of Non-Image Area | | | | | | |
|---|---|---|---|---|---|---|---|---|
| | | Immediately after start | Throughput (m²) | | | | | |
| | | | 50 | 100 | 200 | 300 | 400 | 500 |
| 1 | (1) | ○ | ○ | ○ | ○ | ○ | ○ | ○ |
| 2 | (2) | ○ | ○ | ○ | ○ | ○ | ○ | ○ |
| 3 | (3) | ○ | ○ | ○ | ○ | ○ | ○ | ○ |
| 4 | (4) | ○ | ○ | ○ | ○ | ○ | ○ | ○ |
| 5 | (5) | ○ | ○ | ○ | ○ | ○ | ○ | ○ |
| 6 | (6) | ○ | ○ | ○ | ○ | ○ | ○ | ○ |
| 7 | (7) | ○ | ○ | ○ | ○ | ○ | ○ | ○ |
| 8 | (8) | ○ | ○ | ○ | ○ | ○ | ○ | ○ |
| 9 | (9) | ○ | ○ | ○ | ○ | ○ | ○ | ○ |
| 10 | (10) | ○ | ○ | ○ | ○ | ○ | ○ | ○ |
| 11 | (11) | ○ | ○ | ○ | ○ | ○ | ○ | ○ |
| 12 | (12) | ○ | ○ | ○ | ○ | ○ | ○ | ○ |
| 13 | (13) | ○ | ○ | ○ | ○ | ○ | ○ | ○ |
| 14 | (14) | ○ | ○ | ○ | ○ | ○ | ○ | ○ |
| 15 | (15) | ○ | ○ | ○ | ○ | ○ | ○ | ○ |
| 16 | (16) | ○ | ○ | ○ | ○ | ○ | ○ | ○ |
| 17 | (17) | ○ | ○ | ○ | ○ | ○ | ○ | ○ |
| 18 | (18) | ○ | ○ | ○ | ○ | ○ | ○ | ○ |
| 19 | (19) | ○ | ○ | ○ | ○ | ○ | ○ | ○ |
| 20 | (20) | ○ | ○ | ○ | ○ | ○ | ○ | ○ |
| 21 | (21) | ○ | ○ | ○ | ○ | ○ | ○ | ○ |
| 22 | (22) | ○ | ○ | ○ | ○ | ○ | ○ | ○ |
| 23 | (23) | ○ | ○ | ○ | ○ | ○ | ○ | ○ |
| 24 | (24) | ○ | ○ | ○ | ○ | ○ | ○ | ○ |
| 25 | (25) | ○ | ○ | ○ | ○ | ○ | ○ | ○ |
| 26 | (26) | ○ | ○ | ○ | ○ | ○ | Δ | Δ |
| 27 | (27) | ○ | ○ | ○ | ○ | ○ | ○ | ○ |
| 28 | (28) | ○ | ○ | ○ | ○ | ○ | ○ | ○ |
| 29 | (29) | ○ | ○ | ○ | ○ | ○ | Δ | Δ |
| 30 | (30) | ○ | ○ | ○ | ○ | ○ | ○ | ○ |
| Comparative Ex. 1 | (61) | ○ | ○ | Δ | Δ | X | X | X |

TABLE 3

| Example No. | Nonreducing sugar-containing Developing Solution No. | Development of Non-Image Area | | | | | | |
|---|---|---|---|---|---|---|---|---|
| | | Immediately after start | Throughput (m²) | | | | | |
| | | | 50 | 100 | 200 | 300 | 400 | 500 |
| 31 | (31) | ○ | ○ | ○ | ○ | ○ | ○ | ○ |
| 32 | (32) | ○ | ○ | ○ | ○ | ○ | ○ | ○ |
| 33 | (33) | ○ | ○ | ○ | ○ | ○ | ○ | ○ |
| 34 | (34) | ○ | ○ | ○ | ○ | ○ | ○ | ○ |
| 35 | (35) | ○ | ○ | ○ | ○ | ○ | ○ | ○ |
| 36 | (36) | ○ | ○ | ○ | ○ | ○ | ○ | ○ |
| 37 | (37) | ○ | ○ | ○ | ○ | ○ | ○ | ○ |
| 38 | (38) | ○ | ○ | ○ | ○ | ○ | ○ | ○ |
| 39 | (39) | ○ | ○ | ○ | ○ | ○ | ○ | ○ |
| 40 | (40) | ○ | ○ | ○ | ○ | ○ | ○ | ○ |
| 41 | (41) | ○ | ○ | ○ | ○ | ○ | ○ | ○ |
| 42 | (42) | ○ | ○ | ○ | ○ | ○ | ○ | ○ |
| 43 | (43) | ○ | ○ | ○ | ○ | ○ | ○ | ○ |
| 44 | (44) | ○ | ○ | ○ | ○ | ○ | ○ | ○ |
| 45 | (45) | ○ | ○ | ○ | ○ | ○ | ○ | ○ |
| 46 | (46) | ○ | ○ | ○ | ○ | ○ | ○ | ○ |
| 47 | (47) | ○ | ○ | ○ | ○ | ○ | ○ | ○ |
| 48 | (48) | ○ | ○ | ○ | ○ | ○ | ○ | ○ |
| 49 | (49) | ○ | ○ | ○ | ○ | ○ | ○ | ○ |
| 50 | (50) | ○ | ○ | ○ | ○ | ○ | ○ | ○ |
| 51 | (51) | ○ | ○ | ○ | ○ | ○ | ○ | ○ |
| 52 | (52) | ○ | ○ | ○ | ○ | ○ | ○ | ○ |
| 53 | (53) | ○ | ○ | ○ | ○ | ○ | ○ | ○ |
| 54 | (54) | ○ | ○ | ○ | ○ | ○ | ○ | ○ |
| 55 | (55) | ○ | ○ | ○ | ○ | ○ | ○ | ○ |
| 56 | (56) | ○ | ○ | ○ | ○ | ○ | Δ | Δ |

TABLE 3-continued

| Example No. | Nonreducing sugar-containing Developing Solution No. | Development of Non-Image Area |||||||
|---|---|---|---|---|---|---|---|---|
| | | Immediately after start | 50 | 100 | 200 | 300 | 400 | 500 |
| 57 | (57) | ○ | ○ | ○ | ○ | ○ | ○ | ○ |
| 58 | (58) | ○ | ○ | ○ | ○ | ○ | ○ | ○ |
| 59 | (59) | ○ | ○ | ○ | ○ | ○ | Δ | Δ |
| 60 | (60) | ○ | ○ | ○ | ○ | ○ | ○ | ○ |
| Comparative Ex. 2 | (62) | ○ | ○ | Δ | Δ | X | X | X |

TABLE 4

| Example No. | SiO$_2$-containing Developing Solution No. | Impairment of Image Area |||||||
|---|---|---|---|---|---|---|---|---|
| | | Immediately after start | 50 | 100 | 200 | 300 | 400 | 500 |
| 1 | (1) | ○ | ○ | ○ | ○ | ○ | ○ | ○ |
| 2 | (2) | ○ | ○ | ○ | ○ | ○ | ○ | ○ |
| 3 | (3) | ○ | ○ | ○ | ○ | ○ | ○ | ○ |
| 4 | (4) | ○ | ○ | ○ | ○ | ○ | ○ | ○ |
| 5 | (5) | ○ | ○ | ○ | ○ | ○ | ○ | ○ |
| 6 | (6) | ○ | ○ | ○ | ○ | ○ | ○ | ○ |
| 7 | (7) | ○ | ○ | ○ | ○ | ○ | ○ | ○ |
| 8 | (8) | ○ | ○ | ○ | ○ | ○ | ○ | ○ |
| 9 | (9) | ○ | ○ | ○ | ○ | ○ | ○ | ○ |
| 10 | (10) | ○ | ○ | ○ | ○ | ○ | ○ | ○ |
| 11 | (11) | ○ | ○ | ○ | ○ | ○ | ○ | ○ |
| 12 | (12) | ○ | ○ | ○ | ○ | ○ | ○ | ○ |
| 13 | (13) | ○ | ○ | ○ | ○ | ○ | ○ | ○ |
| 14 | (14) | ○ | ○ | ○ | ○ | ○ | ○ | ○ |
| 15 | (15) | ○ | ○ | ○ | ○ | ○ | ○ | ○ |
| 16 | (16) | ○ | ○ | ○ | ○ | ○ | ○ | ○ |
| 17 | (17) | ○ | ○ | ○ | ○ | ○ | ○ | ○ |
| 18 | (18) | ○ | ○ | ○ | ○ | ○ | ○ | ○ |
| 19 | (19) | ○ | ○ | ○ | ○ | ○ | ○ | ○ |
| 20 | (20) | ○ | ○ | ○ | ○ | ○ | ○ | ○ |
| 21 | (21) | ○ | ○ | ○ | ○ | ○ | ○ | ○ |
| 22 | (22) | ○ | ○ | ○ | ○ | ○ | ○ | ○ |
| 23 | (23) | ○ | ○ | ○ | ○ | ○ | ○ | ○ |
| 24 | (24) | ○ | ○ | ○ | ○ | ○ | ○ | ○ |
| 25 | (25) | ○ | ○ | ○ | ○ | ○ | ○ | ○ |
| 26 | (26) | ○ | ○ | ○ | ○ | ○ | ○ | Δ |
| 27 | (27) | ○ | ○ | ○ | ○ | ○ | ○ | ○ |
| 28 | (28) | ○ | ○ | ○ | ○ | ○ | ○ | ○ |
| 29 | (29) | ○ | ○ | ○ | ○ | ○ | ○ | Δ |
| 30 | (30) | ○ | ○ | ○ | ○ | ○ | ○ | ○ |
| Comparative Ex. 1 | (61) | ○ | ○ | ○ | ○ | Δ | Δ | Δ |

TABLE 5

| Example No. | Nonreducing sugar-containing Developing Solution No. | Impairment of Image Area |||||||
|---|---|---|---|---|---|---|---|---|
| | | Immediately after start | 50 | 100 | 200 | 300 | 400 | 500 |
| 31 | (31) | ○ | ○ | ○ | ○ | ○ | ○ | ○ |
| 32 | (32) | ○ | ○ | ○ | ○ | ○ | ○ | ○ |
| 33 | (33) | ○ | ○ | ○ | ○ | ○ | ○ | ○ |
| 34 | (34) | ○ | ○ | ○ | ○ | ○ | ○ | ○ |
| 35 | (35) | ○ | ○ | ○ | ○ | ○ | ○ | ○ |
| 36 | (36) | ○ | ○ | ○ | ○ | ○ | ○ | ○ |
| 37 | (37) | ○ | ○ | ○ | ○ | ○ | ○ | ○ |

TABLE 5-continued

| Example No. | Nonreducing sugar-containing Developing Solution No. | Impairment of Image Area |||||||
|---|---|---|---|---|---|---|---|---|
| | | Immediately after start | \_\_\_\_ Throughput (m²) \_\_\_\_ |||||||
| | | | 50 | 100 | 200 | 300 | 400 | 500 |
| 38 | (38) | ○ | ○ | ○ | ○ | ○ | ○ | ○ |
| 39 | (39) | ○ | ○ | ○ | ○ | ○ | ○ | ○ |
| 40 | (40) | ○ | ○ | ○ | ○ | ○ | ○ | ○ |
| 41 | (41) | ○ | ○ | ○ | ○ | ○ | ○ | ○ |
| 42 | (42) | ○ | ○ | ○ | ○ | ○ | ○ | ○ |
| 43 | (43) | ○ | ○ | ○ | ○ | ○ | ○ | ○ |
| 44 | (44) | ○ | ○ | ○ | ○ | ○ | ○ | ○ |
| 45 | (45) | ○ | ○ | ○ | ○ | ○ | ○ | ○ |
| 46 | (46) | ○ | ○ | ○ | ○ | ○ | ○ | ○ |
| 47 | (47) | ○ | ○ | ○ | ○ | ○ | ○ | ○ |
| 48 | (48) | ○ | ○ | ○ | ○ | ○ | ○ | ○ |
| 49 | (49) | ○ | ○ | ○ | ○ | ○ | ○ | ○ |
| 50 | (50) | ○ | ○ | ○ | ○ | ○ | ○ | ○ |
| 51 | (51) | ○ | ○ | ○ | ○ | ○ | ○ | ○ |
| 52 | (52) | ○ | ○ | ○ | ○ | ○ | ○ | ○ |
| 53 | (53) | ○ | ○ | ○ | ○ | ○ | ○ | ○ |
| 54 | (54) | ○ | ○ | ○ | ○ | ○ | ○ | ○ |
| 55 | (55) | ○ | ○ | ○ | ○ | ○ | ○ | ○ |
| 56 | (56) | ○ | ○ | ○ | ○ | ○ | ○ | Δ |
| 57 | (57) | ○ | ○ | ○ | ○ | ○ | ○ | ○ |
| 58 | (58) | ○ | ○ | ○ | ○ | ○ | ○ | ○ |
| 59 | (59) | ○ | ○ | ○ | ○ | ○ | ○ | Δ |
| 60 | (60) | ○ | ○ | ○ | ○ | ○ | ○ | ○ |
| Comparative Ex. 2 | (62) | ○ | ○ | ○ | ○ | Δ | Δ | Δ |

TABLE 6

| Example No. | SiO₂-containing Developing Solution No. | Insoluble Matter in Developing Solution |||||||||
|---|---|---|---|---|---|---|---|---|---|
| | | Throughput (plate m²/L) |||||||||
| | | 1 | 10 | 100 | 1 | 10 | 100 | 1 | 10 | 100 |
| | | Storage Temperature |||||||||
| | | 5° C. ||| 20~25° C. ||| 35° C. |||
| 1 | (1) | ○ | ○ | ○ | ○ | ○ | ○ | ○ | ○ | ○ |
| 2 | (2) | ○ | ○ | ○ | ○ | ○ | ○ | ○ | ○ | ○ |
| 3 | (3) | ○ | ○ | ○ | ○ | ○ | ○ | ○ | ○ | ○ |
| 4 | (4) | ○ | ○ | ○ | ○ | ○ | ○ | ○ | ○ | ○ |
| 5 | (5) | ○ | ○ | ○ | ○ | ○ | ○ | ○ | ○ | ○ |
| 6 | (6) | ○ | ○ | ○ | ○ | ○ | ○ | ○ | ○ | ○ |
| 7 | (7) | ○ | ○ | ○ | ○ | ○ | ○ | ○ | ○ | ○ |
| 8 | (8) | ○ | ○ | ○ | ○ | ○ | ○ | ○ | ○ | ○ |
| 9 | (9) | ○ | ○ | ○ | ○ | ○ | ○ | ○ | ○ | ○ |
| 10 | (10) | ○ | ○ | ○ | ○ | ○ | ○ | ○ | ○ | ○ |
| 11 | (11) | ○ | ○ | ○ | ○ | ○ | ○ | ○ | ○ | ○ |
| 12 | (12) | ○ | ○ | ○ | ○ | ○ | ○ | ○ | ○ | ○ |
| 13 | (13) | ○ | ○ | ○ | ○ | ○ | ○ | ○ | ○ | ○ |
| 14 | (14) | ○ | ○ | ○ | ○ | ○ | ○ | ○ | ○ | ○ |
| 15 | (15) | ○ | ○ | ○ | ○ | ○ | ○ | ○ | ○ | ○ |
| 16 | (16) | ○ | ○ | ○ | ○ | ○ | ○ | ○ | ○ | ○ |
| 17 | (17) | ○ | ○ | ○ | ○ | ○ | ○ | ○ | ○ | ○ |
| 18 | (18) | ○ | ○ | ○ | ○ | ○ | ○ | ○ | ○ | ○ |
| 19 | (19) | ○ | ○ | ○ | ○ | ○ | ○ | ○ | ○ | ○ |
| 20 | (20) | ○ | ○ | ○ | ○ | ○ | ○ | ○ | ○ | ○ |
| 21 | (21) | ○ | ○ | ○ | ○ | ○ | ○ | ○ | ○ | ○ |
| 22 | (22) | ○ | ○ | ○ | ○ | ○ | ○ | ○ | ○ | ○ |
| 23 | (23) | ○ | ○ | ○ | ○ | ○ | ○ | ○ | ○ | ○ |
| 24 | (24) | ○ | ○ | ○ | ○ | ○ | ○ | ○ | ○ | ○ |
| 25 | (25) | ○ | ○ | ○ | ○ | ○ | ○ | ○ | ○ | ○ |
| 26 | (26) | ○ | ○ | ○ | ○ | ○ | ○ | ○ | ○ | ○ |
| 27 | (27) | ○ | ○ | ○ | ○ | ○ | ○ | ○ | ○ | ○ |
| 28 | (28) | ○ | ○ | ○ | ○ | ○ | ○ | ○ | ○ | ○ |
| 29 | (29) | ○ | ○ | ○ | ○ | ○ | ○ | ○ | ○ | ○ |
| 30 | (30) | ○ | ○ | ○ | ○ | ○ | ○ | ○ | ○ | ○ |
| Comparative Ex. 1 | (61) | ○ | Δ | X | Δ | X | X | X | X | X |

TABLE 7

| Example No. | Nonreducing sugar containing Developing Solution No. | Insoluble Matter in Developing Solution |||||||||
|---|---|---|---|---|---|---|---|---|---|
| | | Throughput (plate m²/L) |||||||||
| | | 1 | 10 | 100 | 1 | 10 | 100 | 1 | 10 | 100 |
| | | Storage Temperature |||||||||
| | | 5° C. ||| 20~25° C. ||| 35° C. |||
| 31 | (31) | ○ | ○ | ○ | ○ | ○ | ○ | ○ | ○ | ○ |
| 32 | (32) | ○ | ○ | ○ | ○ | ○ | ○ | ○ | ○ | ○ |
| 33 | (33) | ○ | ○ | ○ | ○ | ○ | ○ | ○ | ○ | ○ |
| 34 | (34) | ○ | ○ | ○ | ○ | ○ | ○ | ○ | ○ | ○ |
| 35 | (35) | ○ | ○ | ○ | ○ | ○ | ○ | ○ | ○ | ○ |
| 36 | (36) | ○ | ○ | ○ | ○ | ○ | ○ | ○ | ○ | ○ |
| 37 | (37) | ○ | ○ | ○ | ○ | ○ | ○ | ○ | ○ | ○ |
| 38 | (38) | ○ | ○ | ○ | ○ | ○ | ○ | ○ | ○ | ○ |
| 39 | (39) | ○ | ○ | ○ | ○ | ○ | ○ | ○ | ○ | ○ |
| 40 | (40) | ○ | ○ | ○ | ○ | ○ | ○ | ○ | ○ | ○ |

TABLE 7-continued

Insoluble Matter in Developing Solution

| Example No. | Nonreducing sugar containing Developing Solution No. | Throughput (plate m²/L) | | | | | | | | |
|---|---|---|---|---|---|---|---|---|---|---|
| | | \multicolumn{9}{c}{Storage Temperature} | | | | | | | | | |
| | | 1 | 10 | 100 | 1 | 10 | 100 | 1 | 10 | 100 |
| | | \multicolumn{3}{c}{5° C.} | \multicolumn{3}{c}{20~25° C.} | \multicolumn{3}{c}{35° C.} | | | | | | |
| 41 | (41) | ○ | ○ | ○ | ○ | ○ | ○ | ○ | ○ | ○ |
| 42 | (42) | ○ | ○ | ○ | ○ | ○ | ○ | ○ | ○ | ○ |
| 43 | (43) | ○ | ○ | ○ | ○ | ○ | ○ | ○ | ○ | ○ |
| 44 | (44) | ○ | ○ | ○ | ○ | ○ | ○ | ○ | ○ | ○ |
| 45 | (45) | ○ | ○ | ○ | ○ | ○ | ○ | ○ | ○ | ○ |
| 46 | (46) | ○ | ○ | ○ | ○ | ○ | ○ | ○ | ○ | ○ |
| 47 | (47) | ○ | ○ | ○ | ○ | ○ | ○ | ○ | ○ | ○ |
| 48 | (48) | ○ | ○ | ○ | ○ | ○ | ○ | ○ | ○ | ○ |
| 49 | (49) | ○ | ○ | ○ | ○ | ○ | ○ | ○ | ○ | ○ |
| 50 | (50) | ○ | ○ | ○ | ○ | ○ | ○ | ○ | ○ | ○ |
| 51 | (51) | ○ | ○ | ○ | ○ | ○ | ○ | ○ | ○ | ○ |
| 52 | (52) | ○ | ○ | ○ | ○ | ○ | ○ | ○ | ○ | ○ |
| 53 | (53) | ○ | ○ | ○ | ○ | ○ | ○ | ○ | ○ | ○ |
| 54 | (54) | ○ | ○ | ○ | ○ | ○ | ○ | ○ | ○ | ○ |
| 55 | (55) | ○ | ○ | ○ | ○ | ○ | ○ | ○ | ○ | ○ |
| 56 | (56) | ○ | ○ | ○ | ○ | ○ | ○ | ○ | ○ | ○ |
| 57 | (57) | ○ | ○ | ○ | ○ | ○ | ○ | ○ | ○ | ○ |
| 58 | (58) | ○ | ○ | ○ | ○ | ○ | ○ | ○ | ○ | ○ |
| 59 | (59) | ○ | ○ | ○ | ○ | ○ | ○ | ○ | ○ | ○ |
| 60 | (60) | ○ | ○ | ○ | ○ | ○ | ○ | ○ | ○ | ○ |
| Comparative Ex. 2 | (62) | ○ | Δ | X | Δ | X | X | X | X | X |

Examples 61 to 120 and Comparative Examples 3 and 4

Examples 61 to 120 were carried out by using developing solutions (1) to (60), respectively, to process PS plate (2), and Comparative Examples 3 and 4 were carried out by using developing solutions (61) and (62), respectively, to process PS plate (2).

PS plate (2) were subjected to light-exposure, subsequent development process and evaluation tests in the same manner as Examples 1 to 60 and Comparative Examples 1 and 2. The results are shown in Tables 8 and 9 for development of non-image areas, in Tables 10 and 11 for impairment of image areas, and in Tables 12 and 13 for insoluble matter in developing solution.

TABLE 8

| Example No. | SiO₂-containing Developing Solution No. | Development of Non-Image Area | | | | | | |
|---|---|---|---|---|---|---|---|---|
| | | Immediately after start | \multicolumn{6}{c}{Throughput (m²)} | | | | | |
| | | | 50 | 100 | 200 | 300 | 400 | 500 |
| 61 | (1) | ○ | ○ | ○ | ○ | ○ | ○ | ○ |
| 62 | (2) | ○ | ○ | ○ | ○ | ○ | ○ | ○ |
| 63 | (3) | ○ | ○ | ○ | ○ | ○ | ○ | ○ |
| 64 | (4) | ○ | ○ | ○ | ○ | ○ | ○ | ○ |
| 65 | (5) | ○ | ○ | ○ | ○ | ○ | ○ | ○ |
| 66 | (6) | ○ | ○ | ○ | ○ | ○ | ○ | ○ |
| 67 | (7) | ○ | ○ | ○ | ○ | ○ | ○ | ○ |
| 68 | (8) | ○ | ○ | ○ | ○ | ○ | ○ | ○ |
| 69 | (9) | ○ | ○ | ○ | ○ | ○ | ○ | ○ |
| 70 | (10) | ○ | ○ | ○ | ○ | ○ | ○ | ○ |
| 71 | (11) | ○ | ○ | ○ | ○ | ○ | ○ | ○ |
| 72 | (12) | ○ | ○ | ○ | ○ | ○ | ○ | ○ |
| 73 | (13) | ○ | ○ | ○ | ○ | ○ | ○ | ○ |
| 74 | (14) | ○ | ○ | ○ | ○ | ○ | ○ | ○ |
| 75 | (15) | ○ | ○ | ○ | ○ | ○ | ○ | ○ |
| 76 | (16) | ○ | ○ | ○ | ○ | ○ | ○ | ○ |
| 77 | (17) | ○ | ○ | ○ | ○ | ○ | ○ | ○ |
| 78 | (18) | ○ | ○ | ○ | ○ | ○ | ○ | ○ |
| 79 | (19) | ○ | ○ | ○ | ○ | ○ | ○ | ○ |
| 80 | (20) | ○ | ○ | ○ | ○ | ○ | ○ | ○ |
| 81 | (21) | ○ | ○ | ○ | ○ | ○ | ○ | ○ |
| 82 | (22) | ○ | ○ | ○ | ○ | ○ | ○ | ○ |
| 83 | (23) | ○ | ○ | ○ | ○ | ○ | ○ | ○ |
| 84 | (24) | ○ | ○ | ○ | ○ | ○ | ○ | ○ |

TABLE 8-continued

| Example No. | SiO$_2$-containing Developing Solution No. | Development of Non-Image Area | | | | | | |
|---|---|---|---|---|---|---|---|---|
| | | Immediately after start | Throughput (m$^2$) | | | | | |
| | | | 50 | 100 | 200 | 300 | 400 | 500 |
| 85 | (25) | ○ | ○ | ○ | ○ | ○ | ○ | ○ |
| 86 | (26) | ○ | ○ | ○ | ○ | ○ | ○ | Δ |
| 87 | (27) | ○ | ○ | ○ | ○ | ○ | ○ | Δ |
| 88 | (28) | ○ | ○ | ○ | ○ | ○ | ○ | ○ |
| 89 | (29) | ○ | ○ | ○ | ○ | ○ | ○ | Δ |
| 90 | (30) | ○ | ○ | ○ | ○ | ○ | ○ | ○ |
| Comparative Ex. 3 | (61) | ○ | ○ | Δ | Δ | Δ | X | X |

TABLE 9

| Example No. | Nonreducing sugar-containing Developing Solution No. | Development of Non-Image Area | | | | | | |
|---|---|---|---|---|---|---|---|---|
| | | Immediately after start | Throughput (m$^2$) | | | | | |
| | | | 50 | 100 | 200 | 300 | 400 | 500 |
| 91 | (31) | ○ | ○ | ○ | ○ | ○ | ○ | ○ |
| 92 | (32) | ○ | ○ | ○ | ○ | ○ | ○ | ○ |
| 93 | (33) | ○ | ○ | ○ | ○ | ○ | ○ | ○ |
| 94 | (34) | ○ | ○ | ○ | ○ | ○ | ○ | ○ |
| 95 | (35) | ○ | ○ | ○ | ○ | ○ | ○ | ○ |
| 96 | (36) | ○ | ○ | ○ | ○ | ○ | ○ | ○ |
| 97 | (37) | ○ | ○ | ○ | ○ | ○ | ○ | ○ |
| 98 | (38) | ○ | ○ | ○ | ○ | ○ | ○ | ○ |
| 99 | (39) | ○ | ○ | ○ | ○ | ○ | ○ | ○ |
| 100 | (40) | ○ | ○ | ○ | ○ | ○ | ○ | ○ |
| 101 | (41) | ○ | ○ | ○ | ○ | ○ | ○ | ○ |
| 102 | (42) | ○ | ○ | ○ | ○ | ○ | ○ | ○ |
| 103 | (43) | ○ | ○ | ○ | ○ | ○ | ○ | ○ |
| 104 | (44) | ○ | ○ | ○ | ○ | ○ | ○ | ○ |
| 105 | (45) | ○ | ○ | ○ | ○ | ○ | ○ | ○ |
| 106 | (46) | ○ | ○ | ○ | ○ | ○ | ○ | ○ |
| 107 | (47) | ○ | ○ | ○ | ○ | ○ | ○ | ○ |
| 108 | (48) | ○ | ○ | ○ | ○ | ○ | ○ | ○ |
| 109 | (49) | ○ | ○ | ○ | ○ | ○ | ○ | ○ |
| 110 | (50) | ○ | ○ | ○ | ○ | ○ | ○ | ○ |
| 111 | (51) | ○ | ○ | ○ | ○ | ○ | ○ | ○ |
| 112 | (52) | ○ | ○ | ○ | ○ | ○ | ○ | ○ |
| 113 | (53) | ○ | ○ | ○ | ○ | ○ | ○ | ○ |
| 114 | (54) | ○ | ○ | ○ | ○ | ○ | ○ | ○ |
| 115 | (55) | ○ | ○ | ○ | ○ | ○ | ○ | ○ |
| 116 | (56) | ○ | ○ | ○ | ○ | ○ | ○ | Δ |
| 117 | (57) | ○ | ○ | ○ | ○ | ○ | ○ | ○ |
| 118 | (58) | ○ | ○ | ○ | ○ | ○ | ○ | ○ |
| 119 | (59) | ○ | ○ | ○ | ○ | ○ | ○ | Δ |
| 120 | (60) | ○ | ○ | ○ | ○ | ○ | ○ | ○ |
| Comparative Ex. 4 | (62) | ○ | ○ | Δ | Δ | Δ | X | X |

TABLE 10

| Example No. | SiO$_2$-containing Developing Solution No. | Impairment of Image Area | | | | | | |
|---|---|---|---|---|---|---|---|---|
| | | Immediately after start | Throughput (m$^2$) | | | | | |
| | | | 50 | 100 | 200 | 300 | 400 | 500 |
| 61 | (1) | ○ | ○ | ○ | ○ | ○ | ○ | ○ |
| 62 | (2) | ○ | ○ | ○ | ○ | ○ | ○ | ○ |
| 63 | (3) | ○ | ○ | ○ | ○ | ○ | ○ | ○ |
| 64 | (4) | ○ | ○ | ○ | ○ | ○ | ○ | ○ |
| 65 | (5) | ○ | ○ | ○ | ○ | ○ | ○ | ○ |
| 66 | (6) | ○ | ○ | ○ | ○ | ○ | ○ | ○ |

TABLE 10-continued

| Example No. | SiO$_2$-containing Developing Solution No. | Impairment of Image Area | | | | | | |
|---|---|---|---|---|---|---|---|---|
| | | Immediately after start | Throughput (m$^2$) | | | | | |
| | | | 50 | 100 | 200 | 300 | 400 | 500 |
| 67 | (7) | ○ | ○ | ○ | ○ | ○ | ○ | ○ |
| 68 | (8) | ○ | ○ | ○ | ○ | ○ | ○ | ○ |
| 69 | (9) | ○ | ○ | ○ | ○ | ○ | ○ | ○ |
| 70 | (10) | ○ | ○ | ○ | ○ | ○ | ○ | ○ |
| 71 | (11) | ○ | ○ | ○ | ○ | ○ | ○ | ○ |
| 72 | (12) | ○ | ○ | ○ | ○ | ○ | ○ | ○ |
| 73 | (13) | ○ | ○ | ○ | ○ | ○ | ○ | ○ |
| 74 | (14) | ○ | ○ | ○ | ○ | ○ | ○ | ○ |
| 75 | (15) | ○ | ○ | ○ | ○ | ○ | ○ | ○ |
| 76 | (16) | ○ | ○ | ○ | ○ | ○ | ○ | ○ |
| 77 | (17) | ○ | ○ | ○ | ○ | ○ | ○ | ○ |
| 78 | (18) | ○ | ○ | ○ | ○ | ○ | ○ | ○ |
| 79 | (19) | ○ | ○ | ○ | ○ | ○ | ○ | ○ |
| 80 | (20) | ○ | ○ | ○ | ○ | ○ | ○ | ○ |
| 81 | (21) | ○ | ○ | ○ | ○ | ○ | ○ | ○ |
| 82 | (22) | ○ | ○ | ○ | ○ | ○ | ○ | ○ |
| 83 | (23) | ○ | ○ | ○ | ○ | ○ | ○ | ○ |
| 84 | (24) | ○ | ○ | ○ | ○ | ○ | ○ | ○ |
| 85 | (25) | ○ | ○ | ○ | ○ | ○ | ○ | ○ |
| 86 | (26) | ○ | ○ | ○ | ○ | ○ | ○ | Δ |
| 87 | (27) | ○ | ○ | ○ | ○ | ○ | ○ | ○ |
| 88 | (28) | ○ | ○ | ○ | ○ | ○ | ○ | ○ |
| 89 | (29) | ○ | ○ | ○ | ○ | ○ | ○ | Δ |
| 90 | (30) | ○ | ○ | ○ | ○ | ○ | ○ | ○ |
| Comparative Ex. 3 | (61) | ○ | ○ | ○ | ○ | ○ | Δ | Δ |

TABLE 11

| Example No. | Nonreducing sugar-containing Developing Solution No. | Impairment of Image Area | | | | | | |
|---|---|---|---|---|---|---|---|---|
| | | Immediately after start | Throughput (m$^2$) | | | | | |
| | | | 50 | 100 | 200 | 300 | 400 | 500 |
| 91 | (31) | ○ | ○ | ○ | ○ | ○ | ○ | ○ |
| 92 | (32) | ○ | ○ | ○ | ○ | ○ | ○ | ○ |
| 93 | (33) | ○ | ○ | ○ | ○ | ○ | ○ | ○ |
| 94 | (34) | ○ | ○ | ○ | ○ | ○ | ○ | ○ |
| 95 | (35) | ○ | ○ | ○ | ○ | ○ | ○ | ○ |
| 96 | (36) | ○ | ○ | ○ | ○ | ○ | ○ | ○ |
| 97 | (37) | ○ | ○ | ○ | ○ | ○ | ○ | ○ |
| 98 | (38) | ○ | ○ | ○ | ○ | ○ | ○ | ○ |
| 99 | (39) | ○ | ○ | ○ | ○ | ○ | ○ | ○ |
| 100 | (40) | ○ | ○ | ○ | ○ | ○ | ○ | ○ |
| 101 | (41) | ○ | ○ | ○ | ○ | ○ | ○ | ○ |
| 102 | (42) | ○ | ○ | ○ | ○ | ○ | ○ | ○ |
| 103 | (43) | ○ | ○ | ○ | ○ | ○ | ○ | ○ |
| 104 | (44) | ○ | ○ | ○ | ○ | ○ | ○ | ○ |
| 105 | (45) | ○ | ○ | ○ | ○ | ○ | ○ | ○ |
| 106 | (46) | ○ | ○ | ○ | ○ | ○ | ○ | ○ |
| 107 | (47) | ○ | ○ | ○ | ○ | ○ | ○ | ○ |
| 108 | (48) | ○ | ○ | ○ | ○ | ○ | ○ | ○ |
| 109 | (49) | ○ | ○ | ○ | ○ | ○ | ○ | ○ |
| 110 | (50) | ○ | ○ | ○ | ○ | ○ | ○ | ○ |
| 111 | (51) | ○ | ○ | ○ | ○ | ○ | ○ | ○ |
| 112 | (52) | ○ | ○ | ○ | ○ | ○ | ○ | ○ |
| 113 | (53) | ○ | ○ | ○ | ○ | ○ | ○ | ○ |
| 114 | (54) | ○ | ○ | ○ | ○ | ○ | ○ | ○ |
| 115 | (55) | ○ | ○ | ○ | ○ | ○ | ○ | ○ |
| 116 | (56) | ○ | ○ | ○ | ○ | ○ | ○ | Δ |
| 117 | (57) | ○ | ○ | ○ | ○ | ○ | ○ | ○ |
| 118 | (58) | ○ | ○ | ○ | ○ | ○ | ○ | ○ |

TABLE 11-continued

| Example No. | Nonreducing sugar-containing Developing Solution No. | Impairment of Image Area | | | | | | |
|---|---|---|---|---|---|---|---|---|
| | | Immediately after start | Throughput (m²) | | | | | |
| | | | 50 | 100 | 200 | 300 | 400 | 500 |
| 119 | (59) | ○ | ○ | ○ | ○ | ○ | ○ | Δ |
| 120 | (60) | ○ | ○ | ○ | ○ | ○ | ○ | ○ |
| Comparative Ex. 4 | (62) | ○ | ○ | ○ | ○ | ○ | Δ | Δ |

TABLE 12

Insoluble Matter in Developing Solution

| Example No. | SiO₂-containing Developing Solution No. | Throughput (plate m²/L) | | | | | | | | |
|---|---|---|---|---|---|---|---|---|---|---|
| | | 1 | 10 | 100 | 1 | 10 | 100 | 1 | 10 | 100 |
| | | Storage Temperature | | | | | | | | |
| | | 5° C. | | | 20~25° C. | | | 35° C. | | |
| 61 | (1) | ○ | ○ | ○ | ○ | ○ | ○ | ○ | ○ | ○ |
| 62 | (2) | ○ | ○ | ○ | ○ | ○ | ○ | ○ | ○ | ○ |
| 63 | (3) | ○ | ○ | ○ | ○ | ○ | ○ | ○ | ○ | ○ |
| 64 | (4) | ○ | ○ | ○ | ○ | ○ | ○ | ○ | ○ | ○ |
| 65 | (5) | ○ | ○ | ○ | ○ | ○ | ○ | ○ | ○ | ○ |
| 66 | (6) | ○ | ○ | ○ | ○ | ○ | ○ | ○ | ○ | ○ |
| 67 | (7) | ○ | ○ | ○ | ○ | ○ | ○ | ○ | ○ | ○ |
| 68 | (8) | ○ | ○ | ○ | ○ | ○ | ○ | ○ | ○ | ○ |
| 69 | (9) | ○ | ○ | ○ | ○ | ○ | ○ | ○ | ○ | ○ |
| 70 | (10) | ○ | ○ | ○ | ○ | ○ | ○ | ○ | ○ | ○ |
| 71 | (11) | ○ | ○ | ○ | ○ | ○ | ○ | ○ | ○ | ○ |
| 72 | (12) | ○ | ○ | ○ | ○ | ○ | ○ | ○ | ○ | ○ |
| 73 | (13) | ○ | ○ | ○ | ○ | ○ | ○ | ○ | ○ | ○ |
| 74 | (14) | ○ | ○ | ○ | ○ | ○ | ○ | ○ | ○ | ○ |
| 75 | (15) | ○ | ○ | ○ | ○ | ○ | ○ | ○ | ○ | ○ |
| 76 | (16) | ○ | ○ | ○ | ○ | ○ | ○ | ○ | ○ | ○ |
| 77 | (17) | ○ | ○ | ○ | ○ | ○ | ○ | ○ | ○ | ○ |
| 78 | (18) | ○ | ○ | ○ | ○ | ○ | ○ | ○ | ○ | ○ |
| 79 | (19) | ○ | ○ | ○ | ○ | ○ | ○ | ○ | ○ | ○ |
| 80 | (20) | ○ | ○ | ○ | ○ | ○ | ○ | ○ | ○ | ○ |
| 81 | (21) | ○ | ○ | ○ | ○ | ○ | ○ | ○ | ○ | ○ |
| 82 | (22) | ○ | ○ | ○ | ○ | ○ | ○ | ○ | ○ | ○ |
| 83 | (23) | ○ | ○ | ○ | ○ | ○ | ○ | ○ | ○ | ○ |
| 84 | (24) | ○ | ○ | ○ | ○ | ○ | ○ | ○ | ○ | ○ |
| 85 | (25) | ○ | ○ | ○ | ○ | ○ | ○ | ○ | ○ | ○ |
| 86 | (26) | ○ | ○ | ○ | ○ | ○ | ○ | ○ | ○ | ○ |
| 87 | (27) | ○ | ○ | ○ | ○ | ○ | ○ | ○ | ○ | ○ |
| 88 | (28) | ○ | ○ | ○ | ○ | ○ | ○ | ○ | ○ | ○ |
| 89 | (29) | ○ | ○ | ○ | ○ | ○ | ○ | ○ | ○ | ○ |
| 90 | (30) | ○ | ○ | ○ | ○ | ○ | ○ | ○ | ○ | ○ |
| Comparative Ex. 3 | (61) | ○ | Δ | X | Δ | X | X | X | X | X |

TABLE 13

Insoluble Matter in Developing Solution

| Example No. | Nonreducing sugar containing Developing Solution No. | Throughput (plate m²/L) | | | | | | | | |
|---|---|---|---|---|---|---|---|---|---|---|
| | | 1 | 10 | 100 | 1 | 10 | 100 | 1 | 10 | 100 |
| | | Storage Temperature | | | | | | | | |
| | | 5° C. | | | 20~25° C. | | | 35° C. | | |
| 91 | (31) | ○ | ○ | ○ | ○ | ○ | ○ | ○ | ○ | ○ |
| 92 | (32) | ○ | ○ | ○ | ○ | ○ | ○ | ○ | ○ | ○ |
| 93 | (33) | ○ | ○ | ○ | ○ | ○ | ○ | ○ | ○ | ○ |
| 94 | (34) | ○ | ○ | ○ | ○ | ○ | ○ | ○ | ○ | ○ |
| 95 | (35) | ○ | ○ | ○ | ○ | ○ | ○ | ○ | ○ | ○ |
| 96 | (36) | ○ | ○ | ○ | ○ | ○ | ○ | ○ | ○ | ○ |
| 97 | (37) | ○ | ○ | ○ | ○ | ○ | ○ | ○ | ○ | ○ |
| 98 | (38) | ○ | ○ | ○ | ○ | ○ | ○ | ○ | ○ | ○ |
| 99 | (39) | ○ | ○ | ○ | ○ | ○ | ○ | ○ | ○ | ○ |
| 100 | (40) | ○ | ○ | ○ | ○ | ○ | ○ | ○ | ○ | ○ |
| 101 | (41) | ○ | ○ | ○ | ○ | ○ | ○ | ○ | ○ | ○ |
| 102 | (42) | ○ | ○ | ○ | ○ | ○ | ○ | ○ | ○ | ○ |
| 103 | (43) | ○ | ○ | ○ | ○ | ○ | ○ | ○ | ○ | ○ |
| 104 | (44) | ○ | ○ | ○ | ○ | ○ | ○ | ○ | ○ | ○ |
| 105 | (45) | ○ | ○ | ○ | ○ | ○ | ○ | ○ | ○ | ○ |
| 106 | (46) | ○ | ○ | ○ | ○ | ○ | ○ | ○ | ○ | ○ |
| 107 | (47) | ○ | ○ | ○ | ○ | ○ | ○ | ○ | ○ | ○ |
| 108 | (48) | ○ | ○ | ○ | ○ | ○ | ○ | ○ | ○ | ○ |
| 109 | (49) | ○ | ○ | ○ | ○ | ○ | ○ | ○ | ○ | ○ |
| 110 | (50) | ○ | ○ | ○ | ○ | ○ | ○ | ○ | ○ | ○ |
| 111 | (51) | ○ | ○ | ○ | ○ | ○ | ○ | ○ | ○ | ○ |
| 112 | (52) | ○ | ○ | ○ | ○ | ○ | ○ | ○ | ○ | ○ |
| 113 | (53) | ○ | ○ | ○ | ○ | ○ | ○ | ○ | ○ | ○ |
| 114 | (54) | ○ | ○ | ○ | ○ | ○ | ○ | ○ | ○ | ○ |
| 115 | (55) | ○ | ○ | ○ | ○ | ○ | ○ | ○ | ○ | ○ |
| 116 | (56) | ○ | ○ | ○ | ○ | ○ | ○ | ○ | ○ | ○ |
| 117 | (57) | ○ | ○ | ○ | ○ | ○ | ○ | ○ | ○ | ○ |
| 118 | (58) | ○ | ○ | ○ | ○ | ○ | ○ | ○ | ○ | ○ |
| 119 | (59) | ○ | ○ | ○ | ○ | ○ | ○ | ○ | ○ | ○ |
| 120 | (60) | ○ | ○ | ○ | ○ | ○ | ○ | ○ | ○ | ○ |
| Comparative Ex. 4 | (62) | ○ | Δ | X | Δ | X | X | X | X | X |

Examples 121 to 180 and Comparative Examples 5 and 6

Examples 121 to 180 were carried out by using developing solutions (1) to (60), respectively, to process PS plate (3), and Comparative Examples 5 and 6 were carried out by using developing solutions (61) and (62), respectively, to process PS plate (3).

PS plate (3) were subjected to light-exposure, subsequent development process and evaluation tests in the same manner as Examples 1 to 60 and Comparative Examples 1 and 2. The results are shown in Tables 14 and 15 for development of non-image areas, in Tables 16 and 17 for impairment of image areas, and in Tables 18 and 19 for insoluble matter in developing solution.

TABLE 14

| Example No. | SiO$_2$-containing Developing Solution No. | Development of Non-Image Area | | | | | | |
|---|---|---|---|---|---|---|---|---|
| | | Immediately after start | Throughput (m$^2$) | | | | | |
| | | | 50 | 100 | 200 | 300 | 400 | 500 |
| 121 | (1) | ○ | ○ | ○ | ○ | ○ | ○ | ○ |
| 122 | (2) | ○ | ○ | ○ | ○ | ○ | ○ | ○ |
| 123 | (3) | ○ | ○ | ○ | ○ | ○ | ○ | ○ |
| 124 | (4) | ○ | ○ | ○ | ○ | ○ | ○ | ○ |
| 125 | (5) | ○ | ○ | ○ | ○ | ○ | ○ | ○ |
| 126 | (6) | ○ | ○ | ○ | ○ | ○ | ○ | ○ |
| 127 | (7) | ○ | ○ | ○ | ○ | ○ | ○ | ○ |
| 128 | (8) | ○ | ○ | ○ | ○ | ○ | ○ | ○ |
| 129 | (9) | ○ | ○ | ○ | ○ | ○ | ○ | ○ |
| 130 | (10) | ○ | ○ | ○ | ○ | ○ | ○ | ○ |
| 131 | (11) | ○ | ○ | ○ | ○ | ○ | ○ | ○ |
| 132 | (12) | ○ | ○ | ○ | ○ | ○ | ○ | ○ |
| 133 | (13) | ○ | ○ | ○ | ○ | ○ | ○ | ○ |
| 134 | (14) | ○ | ○ | ○ | ○ | ○ | ○ | ○ |
| 135 | (15) | ○ | ○ | ○ | ○ | ○ | ○ | ○ |
| 136 | (16) | ○ | ○ | ○ | ○ | ○ | ○ | ○ |
| 137 | (17) | ○ | ○ | ○ | ○ | ○ | ○ | ○ |
| 138 | (18) | ○ | ○ | ○ | ○ | ○ | ○ | ○ |
| 139 | (19) | ○ | ○ | ○ | ○ | ○ | ○ | ○ |
| 140 | (20) | ○ | ○ | ○ | ○ | ○ | ○ | ○ |
| 141 | (21) | ○ | ○ | ○ | ○ | ○ | ○ | ○ |
| 142 | (22) | ○ | ○ | ○ | ○ | ○ | ○ | ○ |
| 143 | (23) | ○ | ○ | ○ | ○ | ○ | ○ | ○ |
| 144 | (24) | ○ | ○ | ○ | ○ | ○ | ○ | ○ |
| 145 | (25) | ○ | ○ | ○ | ○ | ○ | ○ | ○ |
| 146 | (26) | ○ | ○ | ○ | ○ | ○ | Δ | Δ |
| 147 | (27) | ○ | ○ | ○ | ○ | ○ | ○ | ○ |
| 148 | (28) | ○ | ○ | ○ | ○ | ○ | ○ | ○ |
| 149 | (29) | ○ | ○ | ○ | ○ | ○ | Δ | Δ |
| 150 | (30) | ○ | ○ | ○ | ○ | ○ | ○ | ○ |
| Comparative Ex. 5 | (61) | ○ | Δ | X | X | X | X | X |

TABLE 15

| Example No. | Nonreducing sugar-containing Developing Solution No. | Development of Non-Image Area | | | | | | |
|---|---|---|---|---|---|---|---|---|
| | | Immediately after start | Throughput (m$^2$) | | | | | |
| | | | 50 | 100 | 200 | 300 | 400 | 500 |
| 151 | (31) | ○ | ○ | ○ | ○ | ○ | ○ | ○ |
| 152 | (32) | ○ | ○ | ○ | ○ | ○ | ○ | ○ |
| 153 | (33) | ○ | ○ | ○ | ○ | ○ | ○ | ○ |
| 154 | (34) | ○ | ○ | ○ | ○ | ○ | ○ | ○ |
| 155 | (35) | ○ | ○ | ○ | ○ | ○ | ○ | ○ |
| 156 | (36) | ○ | ○ | ○ | ○ | ○ | ○ | ○ |
| 157 | (37) | ○ | ○ | ○ | ○ | ○ | ○ | ○ |
| 158 | (38) | ○ | ○ | ○ | ○ | ○ | ○ | ○ |
| 159 | (39) | ○ | ○ | ○ | ○ | ○ | ○ | ○ |
| 160 | (40) | ○ | ○ | ○ | ○ | ○ | ○ | ○ |
| 161 | (41) | ○ | ○ | ○ | ○ | ○ | ○ | ○ |
| 162 | (42) | ○ | ○ | ○ | ○ | ○ | ○ | ○ |
| 163 | (43) | ○ | ○ | ○ | ○ | ○ | ○ | ○ |
| 164 | (44) | ○ | ○ | ○ | ○ | ○ | ○ | ○ |
| 165 | (45) | ○ | ○ | ○ | ○ | ○ | ○ | ○ |
| 166 | (46) | ○ | ○ | ○ | ○ | ○ | ○ | ○ |
| 167 | (47) | ○ | ○ | ○ | ○ | ○ | ○ | ○ |
| 168 | (48) | ○ | ○ | ○ | ○ | ○ | ○ | ○ |
| 169 | (49) | ○ | ○ | ○ | ○ | ○ | ○ | ○ |
| 170 | (50) | ○ | ○ | ○ | ○ | ○ | ○ | ○ |
| 171 | (51) | ○ | ○ | ○ | ○ | ○ | ○ | ○ |
| 172 | (52) | ○ | ○ | ○ | ○ | ○ | ○ | ○ |
| 173 | (53) | ○ | ○ | ○ | ○ | ○ | ○ | ○ |
| 174 | (54) | ○ | ○ | ○ | ○ | ○ | ○ | ○ |
| 175 | (55) | ○ | ○ | ○ | ○ | ○ | ○ | ○ |
| 176 | (56) | ○ | ○ | ○ | ○ | ○ | Δ | Δ |

TABLE 15-continued

| Example No. | Nonreducing sugar-containing Developing Solution No. | Development of Non-Image Area | | | | | | |
|---|---|---|---|---|---|---|---|---|
| | | Immediately after start | 50 | 100 | 200 | 300 | 400 | 500 |
| | | | Throughput (m²) | | | | | |
| 177 | (57) | ○ | ○ | ○ | ○ | ○ | ○ | ○ |
| 178 | (58) | ○ | ○ | ○ | ○ | ○ | ○ | ○ |
| 179 | (59) | ○ | ○ | ○ | ○ | ○ | Δ | Δ |
| 180 | (60) | ○ | ○ | ○ | ○ | ○ | ○ | ○ |
| Comparative Ex. 6 | (62) | ○ | Δ | X | X | X | X | X |

TABLE 16

| Example No. | SiO₂-containing Developing Solution No. | Impairment of Image Area | | | | | | |
|---|---|---|---|---|---|---|---|---|
| | | Immediately after start | 50 | 100 | 200 | 300 | 400 | 500 |
| | | | Throughput (m²) | | | | | |
| 121 | (1) | ○ | ○ | ○ | ○ | ○ | ○ | ○ |
| 122 | (2) | ○ | ○ | ○ | ○ | ○ | ○ | ○ |
| 123 | (3) | ○ | ○ | ○ | ○ | ○ | ○ | ○ |
| 124 | (4) | ○ | ○ | ○ | ○ | ○ | ○ | ○ |
| 125 | (5) | ○ | ○ | ○ | ○ | ○ | ○ | ○ |
| 126 | (6) | ○ | ○ | ○ | ○ | ○ | ○ | ○ |
| 127 | (7) | ○ | ○ | ○ | ○ | ○ | ○ | ○ |
| 128 | (8) | ○ | ○ | ○ | ○ | ○ | ○ | ○ |
| 129 | (9) | ○ | ○ | ○ | ○ | ○ | ○ | ○ |
| 130 | (10) | ○ | ○ | ○ | ○ | ○ | ○ | ○ |
| 131 | (11) | ○ | ○ | ○ | ○ | ○ | ○ | ○ |
| 132 | (12) | ○ | ○ | ○ | ○ | ○ | ○ | ○ |
| 133 | (13) | ○ | ○ | ○ | ○ | ○ | ○ | ○ |
| 134 | (14) | ○ | ○ | ○ | ○ | ○ | ○ | ○ |
| 135 | (15) | ○ | ○ | ○ | ○ | ○ | ○ | ○ |
| 136 | (16) | ○ | ○ | ○ | ○ | ○ | ○ | ○ |
| 137 | (17) | ○ | ○ | ○ | ○ | ○ | ○ | ○ |
| 138 | (18) | ○ | ○ | ○ | ○ | ○ | ○ | ○ |
| 139 | (19) | ○ | ○ | ○ | ○ | ○ | ○ | ○ |
| 140 | (20) | ○ | ○ | ○ | ○ | ○ | ○ | ○ |
| 141 | (21) | ○ | ○ | ○ | ○ | ○ | ○ | ○ |
| 142 | (22) | ○ | ○ | ○ | ○ | ○ | ○ | ○ |
| 143 | (23) | ○ | ○ | ○ | ○ | ○ | ○ | ○ |
| 144 | (24) | ○ | ○ | ○ | ○ | ○ | ○ | ○ |
| 145 | (25) | ○ | ○ | ○ | ○ | ○ | ○ | ○ |
| 146 | (26) | ○ | ○ | ○ | ○ | ○ | ○ | Δ |
| 147 | (27) | ○ | ○ | ○ | ○ | ○ | ○ | ○ |
| 148 | (28) | ○ | ○ | ○ | ○ | ○ | ○ | ○ |
| 149 | (29) | ○ | ○ | ○ | ○ | ○ | ○ | Δ |
| 150 | (30) | ○ | ○ | ○ | ○ | ○ | ○ | ○ |
| Comparative Ex. 5 | (61) | ○ | ○ | ○ | Δ | Δ | X | X |

TABLE 17

| Example No. | Nonreducing sugar-containing Developing Solution No. | Impairment of Image Area | | | | | | |
|---|---|---|---|---|---|---|---|---|
| | | Immediately after start | 50 | 100 | 200 | 300 | 400 | 500 |
| | | | Throughput (m²) | | | | | |
| 151 | (31) | ○ | ○ | ○ | ○ | ○ | ○ | ○ |
| 152 | (32) | ○ | ○ | ○ | ○ | ○ | ○ | ○ |
| 153 | (33) | ○ | ○ | ○ | ○ | ○ | ○ | ○ |
| 154 | (34) | ○ | ○ | ○ | ○ | ○ | ○ | ○ |
| 155 | (35) | ○ | ○ | ○ | ○ | ○ | ○ | ○ |
| 156 | (36) | ○ | ○ | ○ | ○ | ○ | ○ | ○ |
| 157 | (37) | ○ | ○ | ○ | ○ | ○ | ○ | ○ |

TABLE 17-continued

| Example No. | Nonreducing sugar-containing Developing Solution No. | Impairment of Image Area |||||||
|---|---|---|---|---|---|---|---|---|
| | | Immediately after start | \multicolumn{7}{c}{Throughput (m²)} |
| | | | 50 | 100 | 200 | 300 | 400 | 500 |
| 158 | (38) | ○ | ○ | ○ | ○ | ○ | ○ | ○ |
| 159 | (39) | ○ | ○ | ○ | ○ | ○ | ○ | ○ |
| 160 | (40) | ○ | ○ | ○ | ○ | ○ | ○ | ○ |
| 161 | (41) | ○ | ○ | ○ | ○ | ○ | ○ | ○ |
| 162 | (42) | ○ | ○ | ○ | ○ | ○ | ○ | ○ |
| 163 | (43) | ○ | ○ | ○ | ○ | ○ | ○ | ○ |
| 164 | (44) | ○ | ○ | ○ | ○ | ○ | ○ | ○ |
| 165 | (45) | ○ | ○ | ○ | ○ | ○ | ○ | ○ |
| 166 | (46) | ○ | ○ | ○ | ○ | ○ | ○ | ○ |
| 167 | (47) | ○ | ○ | ○ | ○ | ○ | ○ | ○ |
| 168 | (48) | ○ | ○ | ○ | ○ | ○ | ○ | ○ |
| 169 | (49) | ○ | ○ | ○ | ○ | ○ | ○ | ○ |
| 170 | (50) | ○ | ○ | ○ | ○ | ○ | ○ | ○ |
| 171 | (51) | ○ | ○ | ○ | ○ | ○ | ○ | ○ |
| 172 | (52) | ○ | ○ | ○ | ○ | ○ | ○ | ○ |
| 173 | (53) | ○ | ○ | ○ | ○ | ○ | ○ | ○ |
| 174 | (54) | ○ | ○ | ○ | ○ | ○ | ○ | ○ |
| 175 | (55) | ○ | ○ | ○ | ○ | ○ | ○ | ○ |
| 176 | (56) | ○ | ○ | ○ | ○ | ○ | ○ | Δ |
| 177 | (57) | ○ | ○ | ○ | ○ | ○ | ○ | ○ |
| 178 | (58) | ○ | ○ | ○ | ○ | ○ | ○ | ○ |
| 179 | (59) | ○ | ○ | ○ | ○ | ○ | ○ | Δ |
| 180 | (60) | ○ | ○ | ○ | ○ | ○ | ○ | ○ |
| Comparative Ex. 6 | (62) | ○ | ○ | ○ | Δ | Δ | X | X |

TABLE 18

| Example No. | SiO₂-containing Developing Solution No. | Insoluble Matter in Developing Solution |||||||| |
|---|---|---|---|---|---|---|---|---|---|
| | | \multicolumn{9}{c}{Throughput (plate m²/L)} |
| | | 1 | 10 | 100 | 1 | 10 | 100 | 1 | 10 | 100 |
| | | \multicolumn{9}{c}{Storage Temperature} |
| | | \multicolumn{3}{c}{5° C.} | \multicolumn{3}{c}{20~25° C.} | \multicolumn{3}{c}{35° C.} |
| 121 | (1) | ○ | ○ | ○ | ○ | ○ | ○ | ○ | ○ | ○ |
| 122 | (2) | ○ | ○ | ○ | ○ | ○ | ○ | ○ | ○ | ○ |
| 123 | (3) | ○ | ○ | ○ | ○ | ○ | ○ | ○ | ○ | ○ |
| 124 | (4) | ○ | ○ | ○ | ○ | ○ | ○ | ○ | ○ | ○ |
| 125 | (5) | ○ | ○ | ○ | ○ | ○ | ○ | ○ | ○ | ○ |
| 126 | (6) | ○ | ○ | ○ | ○ | ○ | ○ | ○ | ○ | ○ |
| 127 | (7) | ○ | ○ | ○ | ○ | ○ | ○ | ○ | ○ | ○ |
| 128 | (8) | ○ | ○ | ○ | ○ | ○ | ○ | ○ | ○ | ○ |
| 129 | (9) | ○ | ○ | ○ | ○ | ○ | ○ | ○ | ○ | ○ |
| 130 | (10) | ○ | ○ | ○ | ○ | ○ | ○ | ○ | ○ | ○ |
| 131 | (11) | ○ | ○ | ○ | ○ | ○ | ○ | ○ | ○ | ○ |
| 132 | (12) | ○ | ○ | ○ | ○ | ○ | ○ | ○ | ○ | ○ |
| 133 | (13) | ○ | ○ | ○ | ○ | ○ | ○ | ○ | ○ | ○ |
| 134 | (14) | ○ | ○ | ○ | ○ | ○ | ○ | ○ | ○ | ○ |
| 135 | (15) | ○ | ○ | ○ | ○ | ○ | ○ | ○ | ○ | ○ |
| 136 | (16) | ○ | ○ | ○ | ○ | ○ | ○ | ○ | ○ | ○ |
| 137 | (17) | ○ | ○ | ○ | ○ | ○ | ○ | ○ | ○ | ○ |
| 138 | (18) | ○ | ○ | ○ | ○ | ○ | ○ | ○ | ○ | ○ |
| 139 | (19) | ○ | ○ | ○ | ○ | ○ | ○ | ○ | ○ | ○ |
| 140 | (20) | ○ | ○ | ○ | ○ | ○ | ○ | ○ | ○ | ○ |
| 141 | (21) | ○ | ○ | ○ | ○ | ○ | ○ | ○ | ○ | ○ |
| 142 | (22) | ○ | ○ | ○ | ○ | ○ | ○ | ○ | ○ | ○ |
| 143 | (23) | ○ | ○ | ○ | ○ | ○ | ○ | ○ | ○ | ○ |
| 144 | (24) | ○ | ○ | ○ | ○ | ○ | ○ | ○ | ○ | ○ |
| 145 | (25) | ○ | ○ | ○ | ○ | ○ | ○ | ○ | ○ | ○ |
| 146 | (26) | ○ | ○ | ○ | ○ | ○ | ○ | ○ | ○ | ○ |
| 147 | (27) | ○ | ○ | ○ | ○ | ○ | ○ | ○ | ○ | ○ |
| 148 | (28) | ○ | ○ | ○ | ○ | ○ | ○ | ○ | ○ | ○ |
| 149 | (29) | ○ | ○ | ○ | ○ | ○ | ○ | ○ | ○ | ○ |
| 150 | (30) | ○ | ○ | ○ | ○ | ○ | ○ | ○ | ○ | ○ |
| Comparative Ex. 5 | (61) | ○ | Δ | X | Δ | X | X | X | X | X |

TABLE 19

| Example No. | Nonreducing sugar containing Developing Solution No. | Insoluble Matter in Developing Solution |||||||| |
|---|---|---|---|---|---|---|---|---|---|
| | | \multicolumn{9}{c}{Throughput (plate m²/L)} |
| | | 1 | 10 | 100 | 1 | 10 | 100 | 1 | 10 | 100 |
| | | \multicolumn{9}{c}{Storage Temperature} |
| | | \multicolumn{3}{c}{5° C.} | \multicolumn{3}{c}{20~25° C.} | \multicolumn{3}{c}{35° C.} |
| 151 | (31) | ○ | ○ | ○ | ○ | ○ | ○ | ○ | ○ | ○ |
| 152 | (32) | ○ | ○ | ○ | ○ | ○ | ○ | ○ | ○ | ○ |
| 153 | (33) | ○ | ○ | ○ | ○ | ○ | ○ | ○ | ○ | ○ |
| 154 | (34) | ○ | ○ | ○ | ○ | ○ | ○ | ○ | ○ | ○ |
| 155 | (35) | ○ | ○ | ○ | ○ | ○ | ○ | ○ | ○ | ○ |
| 156 | (36) | ○ | ○ | ○ | ○ | ○ | ○ | ○ | ○ | ○ |
| 157 | (37) | ○ | ○ | ○ | ○ | ○ | ○ | ○ | ○ | ○ |
| 158 | (38) | ○ | ○ | ○ | ○ | ○ | ○ | ○ | ○ | ○ |
| 159 | (39) | ○ | ○ | ○ | ○ | ○ | ○ | ○ | ○ | ○ |
| 160 | (40) | ○ | ○ | ○ | ○ | ○ | ○ | ○ | ○ | ○ |

TABLE 19-continued

Insoluble Matter in Developing Solution

| Example No. | Nonreducing sugar containing Developing Solution No. | Throughput (plate m²/L) | | | | | | | | |
|---|---|---|---|---|---|---|---|---|---|---|
| | | Storage Temperature | | | | | | | | |
| | | 5° C. | | | 20~25° C. | | | 35° C. | | |
| | | 1 | 10 | 100 | 1 | 10 | 100 | 1 | 10 | 100 |
| 161 | (41) | ○ | ○ | ○ | ○ | ○ | ○ | ○ | ○ | ○ |
| 162 | (42) | ○ | ○ | ○ | ○ | ○ | ○ | ○ | ○ | ○ |
| 163 | (43) | ○ | ○ | ○ | ○ | ○ | ○ | ○ | ○ | ○ |
| 164 | (44) | ○ | ○ | ○ | ○ | ○ | ○ | ○ | ○ | ○ |
| 165 | (45) | ○ | ○ | ○ | ○ | ○ | ○ | ○ | ○ | ○ |
| 166 | (46) | ○ | ○ | ○ | ○ | ○ | ○ | ○ | ○ | ○ |
| 167 | (47) | ○ | ○ | ○ | ○ | ○ | ○ | ○ | ○ | ○ |
| 168 | (48) | ○ | ○ | ○ | ○ | ○ | ○ | ○ | ○ | ○ |
| 169 | (49) | ○ | ○ | ○ | ○ | ○ | ○ | ○ | ○ | ○ |
| 170 | (50) | ○ | ○ | ○ | ○ | ○ | ○ | ○ | ○ | ○ |
| 171 | (51) | ○ | ○ | ○ | ○ | ○ | ○ | ○ | ○ | ○ |
| 172 | (52) | ○ | ○ | ○ | ○ | ○ | ○ | ○ | ○ | ○ |
| 173 | (53) | ○ | ○ | ○ | ○ | ○ | ○ | ○ | ○ | ○ |
| 174 | (54) | ○ | ○ | ○ | ○ | ○ | ○ | ○ | ○ | ○ |
| 175 | (55) | ○ | ○ | ○ | ○ | ○ | ○ | ○ | ○ | ○ |
| 176 | (56) | ○ | ○ | ○ | ○ | ○ | ○ | ○ | ○ | ○ |
| 177 | (57) | ○ | ○ | ○ | ○ | ○ | ○ | ○ | ○ | ○ |
| 178 | (58) | ○ | ○ | ○ | ○ | ○ | ○ | ○ | ○ | ○ |
| 179 | (59) | ○ | ○ | ○ | ○ | ○ | ○ | ○ | ○ | ○ |
| 180 | (60) | ○ | ○ | ○ | ○ | ○ | ○ | ○ | ○ | ○ |
| Comparative Ex. 6 | (62) | ○ | Δ | X | Δ | X | X | X | X | X |

According to the plate making method of the present invention, the developing solution can suppress the occurrence of developing sludge in course of process by favorably dispersing insoluble matter originated from components in the image recording layer. Thus, the plate making method makes it possible to prevent the developing sludge from adhering to the surface of the plate, and perform a stable processing procedure of PS plate in extended periods of time.

The plate making method of the present invention can form a high-definition image with improved sharpness in a lithographic printing plate without damages to the image areas, simultaneously favorable developing performance to the non-image areas being retained.

What is claimed is:

1. A method for making a lithographic printing plate comprising the steps of:
light-exposing to infrared radiation, a heat-sensitive presensitized plate of a positive-working mode for use in making a lithographic printing plate, said presensitized plate comprising a substrate and an image recording layer which is formed thereon and comprises a novolak resin containing xylenol as a monomer component and an infrared absorbing dye; and
developing the light-exposed plate with an alkaline developing solution comprising at least one surfactant selected from the group consisting of anionic surfactants represented by the following formulas (I), (II), (III) and (IV) and amphoteric surfactants represented by the following formulas (V) and (VI):

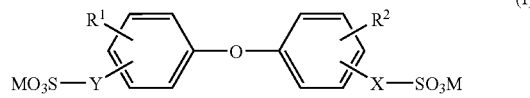

(I)

wherein $R^1$ and $R^2$ independently represent hydrogen atom or an alkyl group which may be in the form of linear or branched claim, X and Y indepenendently represent a single bond or the formula —O—$(CH_2CH_2O)n$- wherein n is an integer of from 1 to 100, and M represents a monovalent alkali metal,

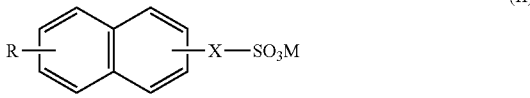

(II)

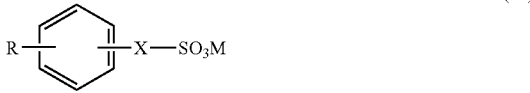

(III)

wherein, R represents hydrogen atom or an alkyl group which may be in the form of linear or branched chain, X represents a single bond or the formula —O—$(CH_2CH_2O)n$- wherein n is an integer of from 1 to 100, and M represents a monovalent alkali metal,

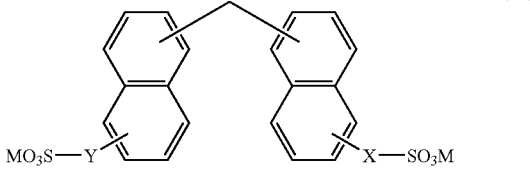

(IV)

wherein X and Y independently represent a single bond or the formula —O—$(CH_2CH_2O)n$- wherein n is an integer of from 1 to 100, and M represents a monovalent alkali metal

$R^3$—NH—$(CH_2)_m$COOR'  (V)

(VI)

wherein each $R^3$ and $R^4$ represents a hydrocarbon group having carbon atoms of from 2 to 30, and each R', R" and R'" represents a hydrogen atom or a monovalent alkali metal, and each m, n and p represents an integer of from 1 to 10.

2. The method of claim 1, wherein the xylenol used in the novolak resin is at least one selected from the group consisting of 3,5-xylenol, 2,3-xylenol, 2,5-xylenol and 3,4-xylenol.

3. The method of claim 1, wherein the novolak resin containing xylenol as a monomer component has a weight-average molecular weight of 500 to 10,000.

4. The method of claim 1, wherein the developing solution comprises at least one anionic surfactant.

5. The method of claim 1 wherein the developing solution comprises at least one amphoteric surfactant.

6. The method of claim 1 wherein the developing solution comprises at least one surfactant selected from the group consisting of anionic surfactants and amphoteric surfactants in an amount of from 0.001 to 10% by weight.

* * * * *